United States Patent [19]
Nemoto et al.

[11] Patent Number: 5,713,673
[45] Date of Patent: Feb. 3, 1998

[54] RECORDING HEAD, RECORDING DEVICE AND RECORDING METHOD

[75] Inventors: Kazuhiko Nemoto; Osamu Matsuda; Masato Doi, all of Kanagawa, Japan

[73] Assignee: Sony Corporation, Tokyo, Japan

[21] Appl. No.: 723,833

[22] Filed: Sep. 30, 1996

Related U.S. Application Data

[63] Continuation of Ser. No. 393,688, Feb. 24, 1995, abandoned.

[30] Foreign Application Priority Data

Mar. 11, 1994 [JP] Japan .................... 6-067818

[51] Int. Cl.$^6$ .................................................. B41J 2/05
[52] U.S. Cl. .................. 400/120.02; 347/51; 347/43
[58] Field of Search ........................ 347/20, 24, 51, 347/52, 43; 400/120.01, 120.02

[56] References Cited

U.S. PATENT DOCUMENTS

| | | | |
|---|---|---|---|
| 4,060,323 | 11/1977 | Hirayama et al. | 347/239 |
| 4,531,138 | 7/1985 | Endo et al. | 347/51 |
| 4,723,129 | 2/1988 | Endo et al. | 347/51 |
| 5,021,808 | 6/1991 | Kohyama | 347/51 |
| 5,500,662 | 3/1996 | Watanabe | 347/43 |

*Primary Examiner*—John S. Hilten
*Attorney, Agent, or Firm*—Hill, Steadman & Simpson

[57] ABSTRACT

A print head, printer and recording method wherein dye recording materials 22Y, 22M, 22C are irradiated by a laser beam L or the like so as to vaporize them, and transport them to a recording medium such as an imaging paper, and the path of a beam from a heating beam emitting means, for example a laser 18, is changed so as to selectively cause the beam to impinge on one of the plurality of recording materials. By using the same heating beam emitting means for the plurality of recording materials, the structure of the head comprising the heating beam emitting means is simplified and its assembly is easier. Moreover, as a common heating beam emitting means may be used, its manufacture is easy, and the electrode wiring in the heating beam emitting means is easily implemented.

22 Claims, 21 Drawing Sheets

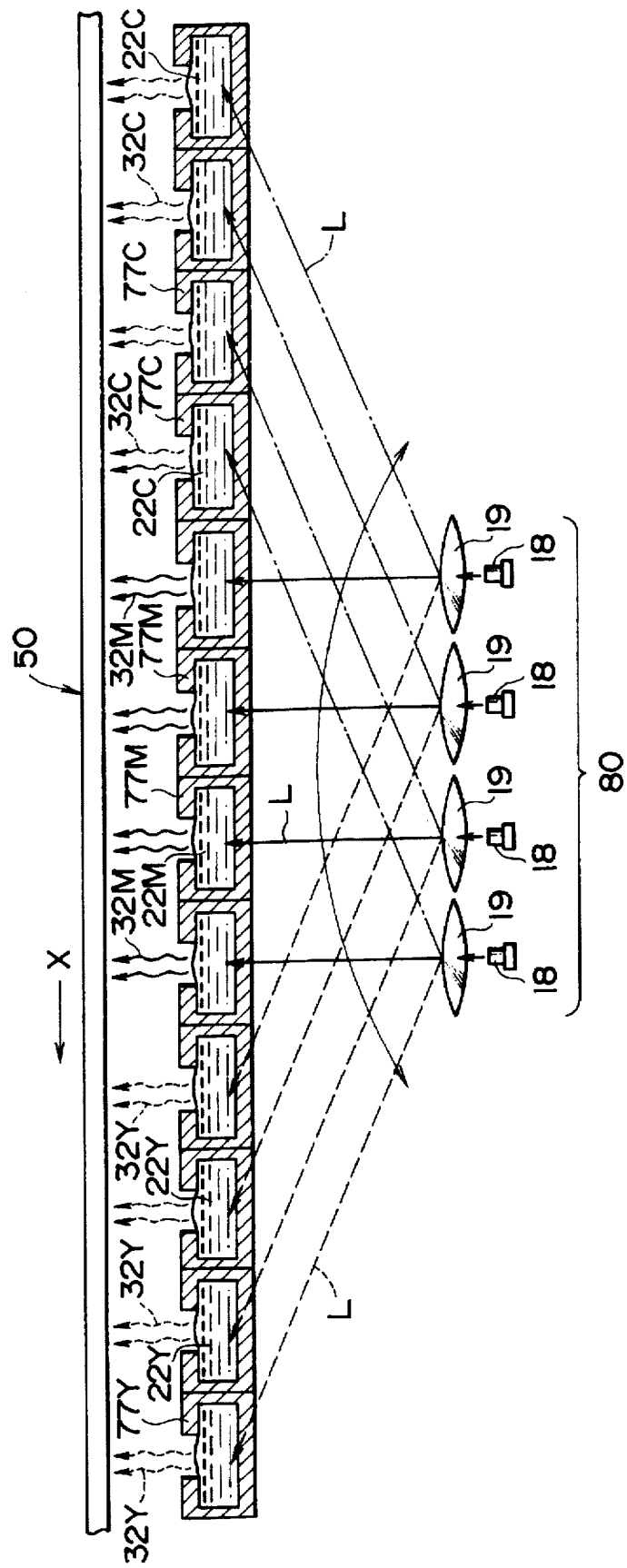

ns of the recording head, recording device (in particular, a laser beam printer), and a recording method.

RECORDING HEAD, RECORDING DEVICE AND RECORDING METHOD

This is a continuation of application Ser. No. 08/393,688, filed Feb. 24, 1995, now abandoned.

BACKGROUND OF THE INVENTION

1. Field of the Invention

This invention relates to a recording head, recording device (in particular, a laser beam printer), and a recording method.

2. Description of the Related Art

In recent years, there has been an increasing need not only for monochrome recording, but also for color printouts in image recording by video cameras, televisions and computer graphics. Various types of printer have therefore been developed for use in a variety of different fields.

In one of these recording methods, an ink sheet coated with an ink layer consisting of a transfer dye dispersed at high concentration in a suitable binder resin, is brought into contact under a constant pressure with a transfer medium such as an imaging paper coated with a dyeing resin to receive the transferred dye, heat is applied from a thermosensitive head situated above the ink sheet according to image information, and the transfer dye is transferred depending on this heating from the ink sheet to the dye-receiving layer.

In this heat transfer process, the above procedure may for example be repeated for image signals split into three primary colors used in subtractive color mixing, i.e. yellow, magenta and cyan, so as to give a full color image. The equipment is compact, requires little maintenance and permits images to be obtained immediately, and as the images are of the same high quality as those produced by silver halide color photography, the process is highly regarded.

FIG. 15 is a schematic front view of the main parts of a printer using this heat transfer system. In this printer, a thermosensitive recording head (referred to hereinafter as a thermal head) 1 is disposed opposite a platen roller 3. An ink sheet 12 provided with an ink layer 12a on a base film 12b, and a recording medium (transfer medium) 20 provided with a dyeing resin layer (dye-receiving layer) 20a on a paper 20b, are pressed together by the platen roller 3 pressing against the thermal head 1.

Inks (transfer dyes) in the ink layer 12a selectively heated by the thermal head 1 are thereby transferred in the form of dots to the dyeing resin layer 20a of the transfer medium 20 as heat transfer recording proceeds. In this heat transfer recording process, a line method wherein a long thermal head is fixed at right angles to the travel direction of the recording paper, or a serial method wherein the thermal head is made to oscillate in a direction at right angles to the travel direction of the recording paper, is adopted.

In Ser. No. 08/434,853, a co-worker of the instant applicants already proposed a non-contact type dye vaporizing laser beam printer (LBP) shown in FIG. 16 which, while retaining the advantages of the aforesaid heat transfer recording, also produces less waste, has a lower energy requirement to accomplish the transfer process, and allows the use of a more compact and lightweight printer.

According to this recording technique, a recording head (printer head) 10 comprising a thermofusible dye layer 22 in a vaporizer 17, and a recording medium (imaging paper) 50 having a receiving layer 50a for receiving vaporized (or sublimed) dye, are separated by a minute gap 11.

The liquefied dye 22 in a dye receptacle 37 of the vaporizer 17 of the recording head 10 is then selectively heated and vaporized by irradiating with a laser beam L, vaporized dye 32 is caused to escape into the gap 11, and the dye is transferred from a vaporizing hole 23 to the imaging paper 50, which is the recording medium, so as to obtain an image with continuous gradation. By repeating this process for image signals split into three primary colors used in subtractive color mixing, viz. yellow, magenta and cyan, a full color image can be obtained.

In this recording method, the imaging paper 50 may for example be disposed above the recording head 10, the dye being irradiated by a laser beam 1 emitted from a laser 18 and converged by a lens 19 so that the vaporized dye 32 is carried or transported upwards from the upper surface of the vaporizer 17. Alternatively, a dye reservoir 15 may be provided in a head base 14 transparent to laser light, the liquefied dye 22 filled between spacers 18 fixed on a head base 14, and the liquefied dye 22 supplied to the vaporizer 17 via a dye passage 27. In this case, in order to improve the efficiency of supplying dye to the vaporizer 17 and the efficiency of vaporization, minute irregularities formed by small columns 21, which supply and retain dye by means of a capillary effect, may be provided in the vaporizer 17.

Protective plates 29 are fixed on the spacers 28 to guide the imaging paper 50 which moves in a direction X separated by the gap 11. Heaters 16 are embedded in these protective plates 29 to keep the dye liquid, but these heaters may alternatively be embedded in the dye receptacle (in the aforesaid passage 17 and dye reservoir 15).

A printer housing this printer head may for example be provided with dye reservoirs 15Y, 15M, 15C for yellow, magenta and cyan for full color use in the common base 14, these dyes of different color being supplied to a line of vaporizers 17Y, 17M, 17C forming from 12 to 24 dots.

Laser beams emitted by a multi-laser array 30 comprising from 12 to 24 lasers (in particular, semiconductor laser chips) 18 corresponding to the vaporizers, are converged by a micro-lens array 31 comprising a plurality of the converging lens 19.

As described hereintofore, according to this dye vaporizing laser beam printer, the amount of dye that has been used for recording is restored by allowing dye to flow continuously in the liquid state from the dye reservoir to the vaporizer. This is possible because the dye contains almost no binder resin. The vaporizer used for recording may also be used numerous times repeatedly, and in comparison to an ink sheet which can be used only once in the aforesaid heat transfer process, it is more advantageous from the viewpoint of energy saving and environmental conservation.

As a vaporized dye is used, recording may be performed without the dye layer and recording medium (imaging paper) coming into contact. Hence, there is no reverse transfer or color mixing of dye as is seen in the aforesaid heat transfer process in the second and subsequent printing operations. Further, as a dye reservoir of small volume is used instead of an ink sheet to supply dye, the printer can be made more compact and lightweight.

In this recording system, as the dye is vaporized or sublimed, there is no need to heat the dye receiving layer of the recording medium as in the case of the aforesaid heat transfer process, and no need to press the ink sheet and recording medium together under high pressure which also makes for greater compactness and lightweightness of the printer. Moreover, as the dye layer of the vaporizer and the recording medium do not come into contact, thermal adhesion between the two cannot occur, and recording can be performed even if the dye and receiving layer resin are not highly compatible. This permits a far greater freedom of design and choice with regard to the dyes and receiving layer resins that can be used.

The semiconductor laser 18 is used as a light source to supply heat energy to vaporize (or sublime) the dye. In a semiconductor laser, power is converted to light very efficiently, and as such a laser also has excellent directional and focusing properties, heat energy transmission efficiency in the dye is extremely high. As a result, heat utilization efficiency is far higher than in the case of the conventional system (heat transfer or ink jet using the aforementioned thermal head), and also contributes to greater compactness and power saving.

Further, in conventional ink jet color printers, color gradation was difficult. However, using a semiconductor laser, output power and pulse width can be easily controlled, hence multi-gradation of color are achieved without difficulty in the recording system of this invention.

In dye vaporizing laser beam printers, if a single beam laser array is used, printing is performed one dot at a time so that the printing speed is slow. To overcome this problem, therefore, a multi-beam laser may be used.

A one-dimensional laser array 30 may be manufactured wherein laser elements, arranged in a line as shown in FIG. 16 and FIG. 17, operate independently of each other. According to this arrangement, the printing speed that can be achieved is multiplied by at least the number of beams (e.g. if a 24 beam laser array is used, the speed is 24 times greater).

In the printer head 10, therefore, a number of the liquefied dyes 22 corresponding to the number of recording dots are housed in the dye receptacles 37, the lasers 18 also being disposed in the form of laser arrays comprising light emitting points 18a corresponding to the number of recording dots.(refer to FIG. 19 described hereinafter). Likewise, in the aforesaid heat transfer printer that does not use the lasers 18, the heating elements of the thermal head 1 are also disposed in the form of a dot array.

In any type of printer including those described hereinabove, printing is performed by feeding the paper in a vertical direction (X direction) and scanning with the head in a horizontal direction (Y direction) which is perpendicular to the X direction, as shown in FIG. 17. This vertical paper feed and horizontal head scan are executed alternately.

However, after considering the aforesaid heat transfer printer and the dye vaporizing laser beam printer, the Inventors concluded that, although these printers have various advantages, their use still presents some problems as will now be described.

For example, in the aforesaid dye vaporizing laser beam printer (as in the aforesaid heat transfer printer), the simplest way of performing multi-color printing is to provide three sets of heads (four sets if black is also required), these heads being made compact and arranged next to each other so as to form a multi-color printing head.

In other words, three one-dimensional laser arrays for printing different colors are arranged next to each other in the head scanning direction Y, as shown in FIG. 18. More specifically, the dye reservoirs 15C, 15M, 15Y containing cyan, magenta and yellow liquefied dyes 22C, 22M, 22Y for full color printing may for example comprise dye receptacles or dye supply heads 37C, 37M, 37Y provided in the base 14, the dyes being supplied to lines of the vaporizers 17C, 17M, 17Y that form from 12 to 24 dots, and vaporized dyes 32C, 32M, 32Y generated so as to be carried or transported onto the imaging paper 50, as shown in FIGS. 19A and 19B and FIG. 20.

In each vaporizer, a laser beam from the corresponding laser 18 (in particular, a semiconductor laser chip) consisting of a multi-laser array 30 of from 12 to 24 elements, is converged by the micro-lens array 31 comprising a plurality of the converging lenses 19 (36 is a mirror for guiding the laser beam L in a perpendicular direction). The converging lens may be a lens system of the type shown, however one large diameter converging lens 38 as shown by the imaginary line may also be used. This converging lens 38 is formed in such a way that the refraction path is varied so that the emergent beam impinges on the vaporizers 17C, 17M, 17Y depending on the position of the incident beam. The multi-laser array 30 is driven by a control IC 34 provided in the substrate 33, and generated heat is adequately dissipated by a heat sink 35.

In the printer head shown in FIGS. 18–20, the three laser arrays 30 must be precisely aligned in a small package, however it is difficult to accurately construct and assemble such a package in practice. In other words, if these lens arrays do not correspond exactly with the converging lenses and dye receptacles (vaporizers), selective dye vaporizing (and therefore accurate dot recording) cannot be performed. Each component part of the package must therefore be manufactured to set dimensions and sizes, and assembled with high precision.

Alternatively, the use of a two-dimensional planar emitting array 30' may be shared by the three dye receptacles aligned in the scanning direction Y, as shown in FIG. 21. According to this method, due to the monolithic two-dimensional laser construction, the assembly of the laser array is less difficult than in the case of the method depicted in FIG. 18 and FIGS. 19A and 19B.

However, in the method of FIG. 21, the manufacture of the laser element (two-dimensional planar laser) itself is difficult, which easily leads to lower yields and higher costs. Further, electrode wiring which is not transparent to laser light has to be kept clear of the light-emitting region, but in the case of a two-dimensional laser (and especially when there are three or more dye receptacles), this is difficult to do.

SUMMARY OF THE INVENTION

It is therefore an object of this invention to provide a recording head, recording device and recording method which, particularly when used to perform recording with a plurality of recording materials such as in the case of multi-color printing, offer a structural simplification of component parts such as lasers or other heating means, make assembly easier, and permit easy manufacture of the heating means itself and wiring.

This invention concerns a recording head wherein a plurality of recording materials (e.g. vaporizable yellow, magenta and cyan dyes) are vaporized by irradiating with a heating beam (e.g. a laser beam), and transferred to a recording medium (e.g. an imaging paper), and wherein this head comprises a beam path change-over means (e.g. a mirror such as a galvanized mirror) that changes the path of a heating beam from a heating beam emitting means (e.g. a multi-laser array), so as to cause it to impinge selectively on one of the plurality of recording materials. In this context, the expression "plurality of recording materials" includes not only recording materials of different colors, but also recording materials of the same color disposed in the form of a plurality of dots.

According to this invention, the path of the heating beam from the heating beam emitting means is made to impinge selectively on one of a plurality of recording materials, so common (in particular, one) heating beam emitting means may be used for a plurality of recording materials. This simplifies the structure of the head comprising the heating beam emitting means, and makes its assembly easier.

Moreover, as a common (in particular, one) heating beam emitting means may be used, it is easily manufactured, and the electrode wiring required in the vicinity of the heating beam emitting means is also simplified.

In the recording head and recording device according to this invention, the aforesaid beam path change-over means may consist of a galvanized mirror or other mirror, for example a movable, compact reflecting mirror such as a DMD (Deformable Mirror Device), or a wobbling element. Alternatively, the focusing lens (converging lens) used to focus the emerging beam from the heating beam emitting means may be movable, this focusing lens being used as the beam path change-over means. Still further, the beam path change-over means may consist of a combination of a diffraction member (e.g. a diffraction grating or diffraction lens such as a grating) and a shutter member (e.g. a liquid crystal shutter).

Recording materials of different colors (e.g. yellow, magenta, cyan dyes, and black dye if necessary) may be respectively contained in at least two recording material receptacles, and multi-color recording (e.g. full color imaging) performed. This invention is however not limited to such an arrangement, and may also be used to perform monochrome gradation recording.

This invention is suitable for the aforementioned non-contact type dye vaporizing printers wherein a recording material layer is separated from a recording medium by a gap, and a vaporized recording material is transferred (in particular, carried over) to the recording medium across this gap. However, if heating of recording materials is performed selectively by providing a heating beam emitting means as heating means and varying the beam path as described hereintofore, it may be applied also to contact type printers.

This invention therefore provides a recording device (in particular, a non-contact type dye vaporizing laser beam printer) having a recording head according to this invention as described hereintofore, and a recording method (in particular, multi-color printing) using the recording head or recording device according to this invention.

BRIEF DESCRIPTION OF THE DRAWINGS

FIG. 12 is a sectional view of the same printer head.

DETAILED DESCRIPTION OF THE PREFERRED EMBODIMENTS

This invention will now be described with reference to specific examples.

FIGS. 1–6 illustrate a first example of this invention applied to a non-contact type dye vaporizing laser beam printer (e.g. a video printer).

Figure 1:
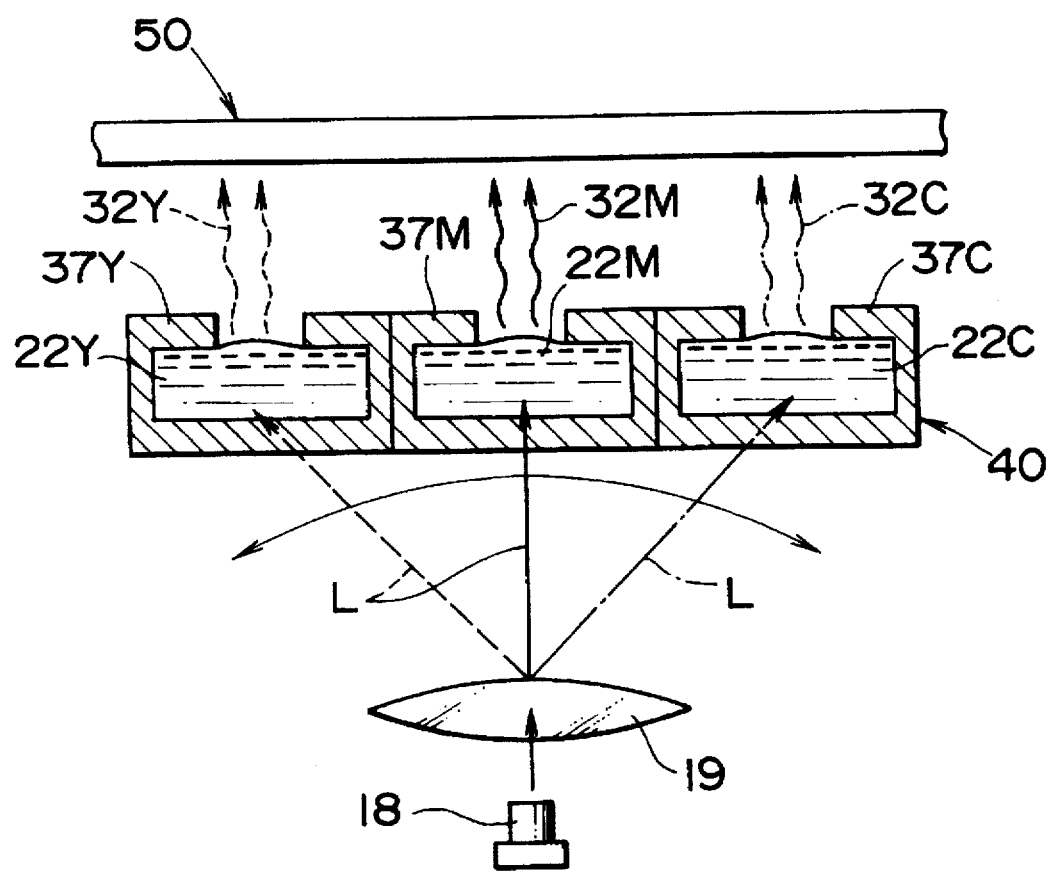
FIG. 1 is a schematic sectional view of a printer head according to a first embodiment of this invention.
Figure 2:
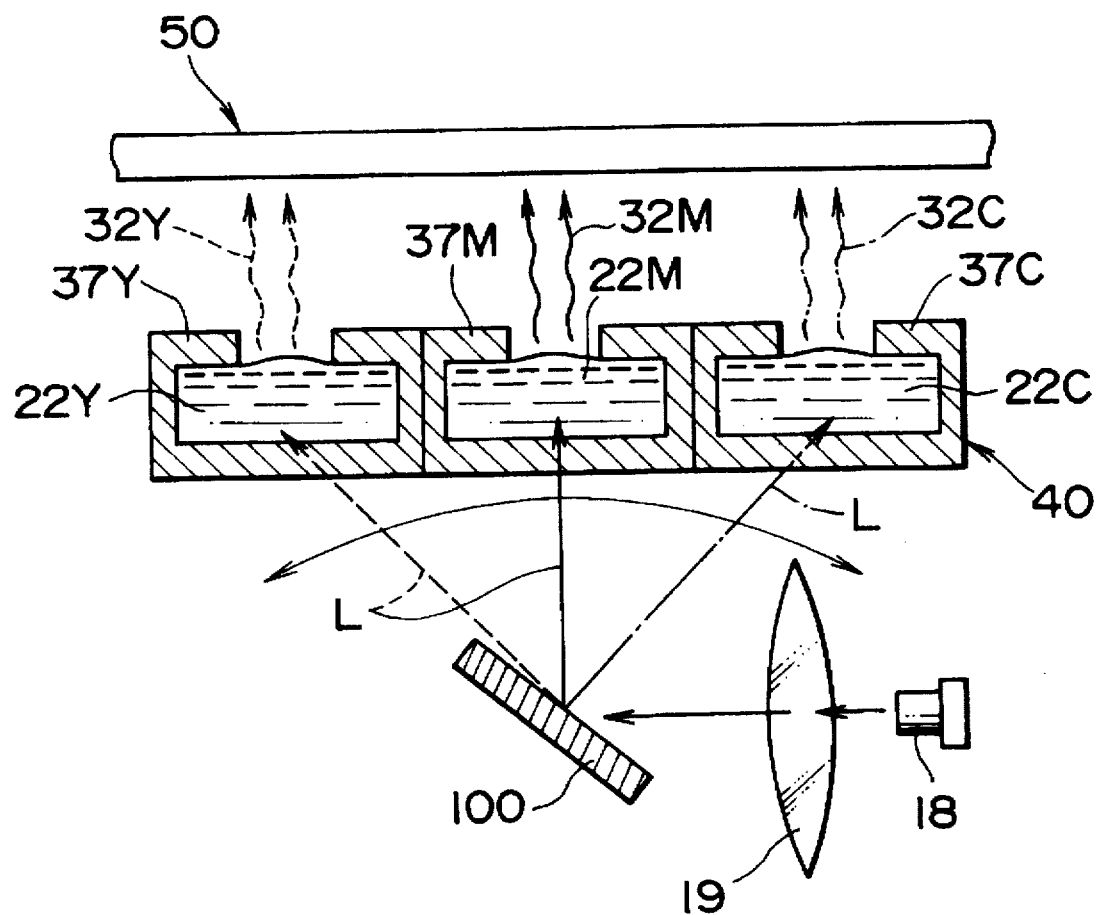
FIG. 2 is a schematic sectional view of a specific example of the same printer head.
Figure 3:
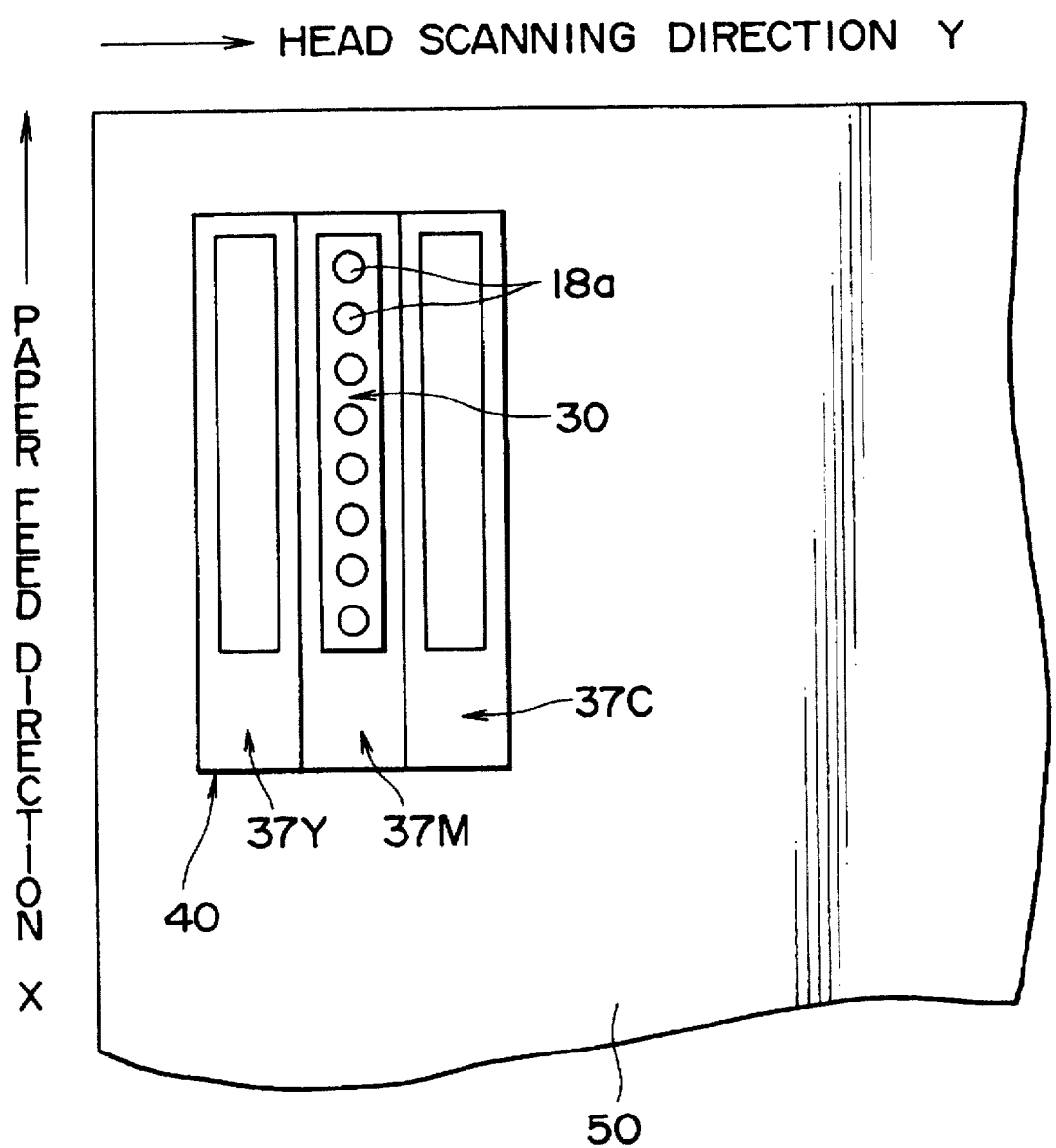
FIG. 3 is a schematic view of the rear of the same printer head.
Figure 4:
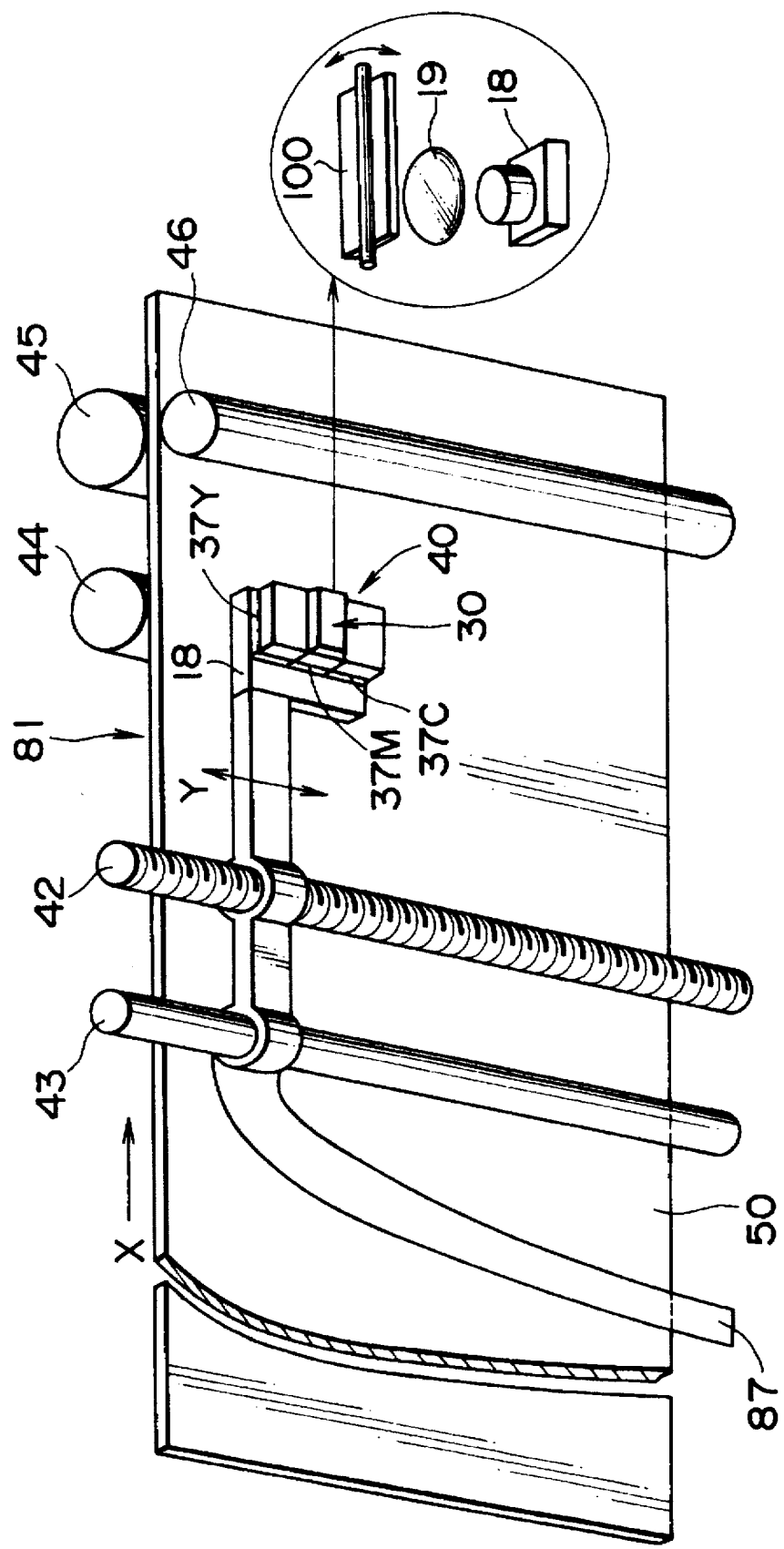
FIGS. 4A and 4B illustrate a schematic view of the same printer head seen from underneath.
Figure 5:
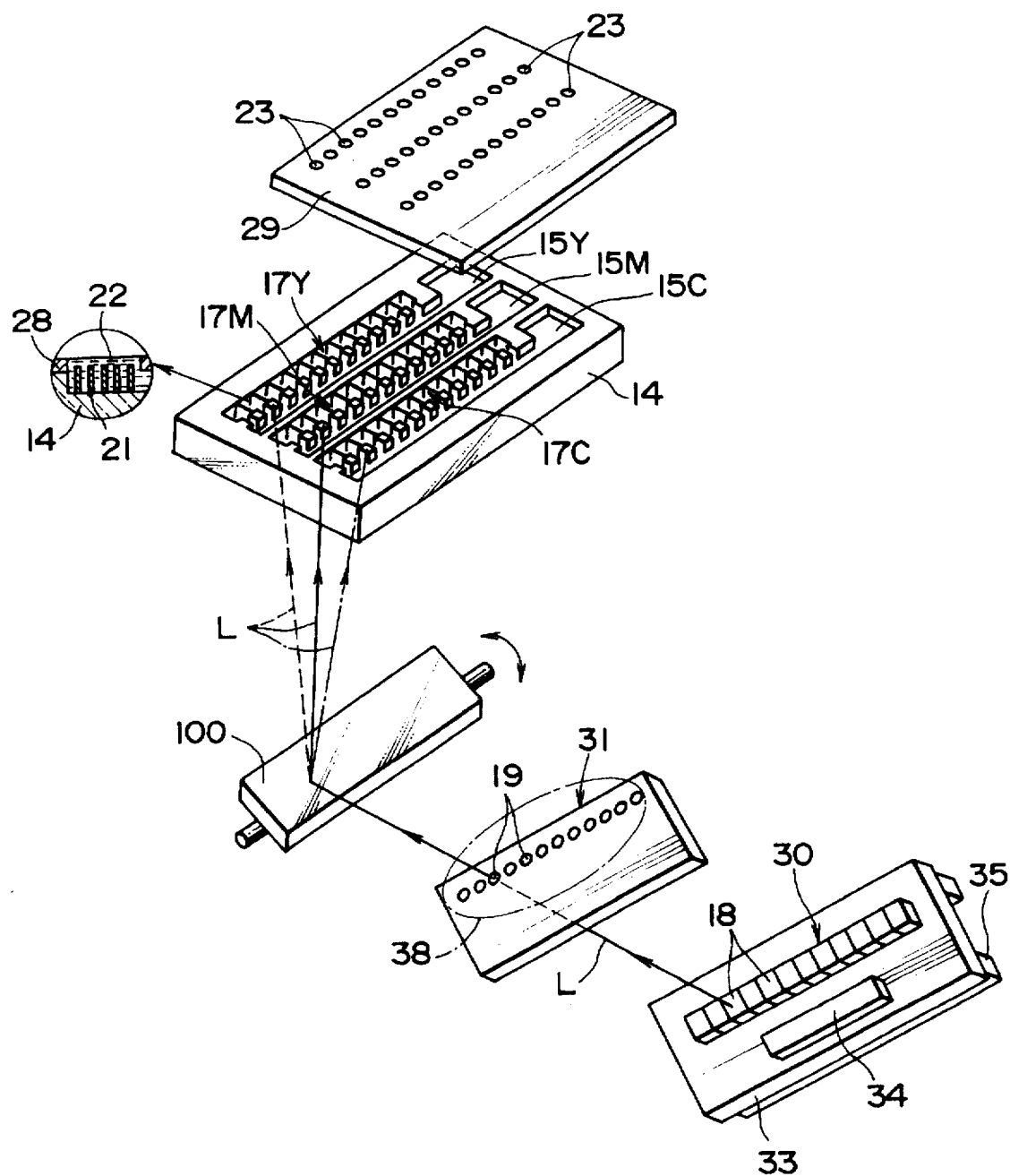
FIGS. 5A and 5B illustrate a schematic cutaway perspective view of the same printer head.

In a printer head 40 according to this example, as shown in FIGS. 2 and 3, a single multi (beam) laser array 30 comprising a plurality of lasers 18 is provided for three dyes, i.e. yellow 22Y, magenta 22M, cyan 22C used for multi-color (in particular, full color) printing, these dyes being contained in dye receptacles 37Y, 37M, 37C. The path of the laser beam L emitted by this array may be changed as shown by the solid line, broken line and semi-broken line so as to selectively impinge on each of the dye receptacles, and perform recording in the form of dots in each of these respective colors.

The means used to change the path of the laser beam L may consist of a galvanized mirror 100 as shown in FIG. 2 common to all the lasers (or provided separately for each of them).

This galvanized mirror 100 receives a drive signal that rotates it through a predetermined angle so as to change the path of the beam (i.e. select the color) during recording (when the dyes are vaporized by the laser beam). The beam is thereby directed toward each of the dyes 22M, 22Y, 22C as shown by the solid line, broken line and semi-broken line in FIG. 2. This may easily be achieved by tracking servo technology known in the art. The laser 18 has been enlarged in FIGS. 4A and 4B for the sake of clarification, however it is actually disposed in the form of the array 30 as shown in FIGS. 5A and 5B.

Figure 6:
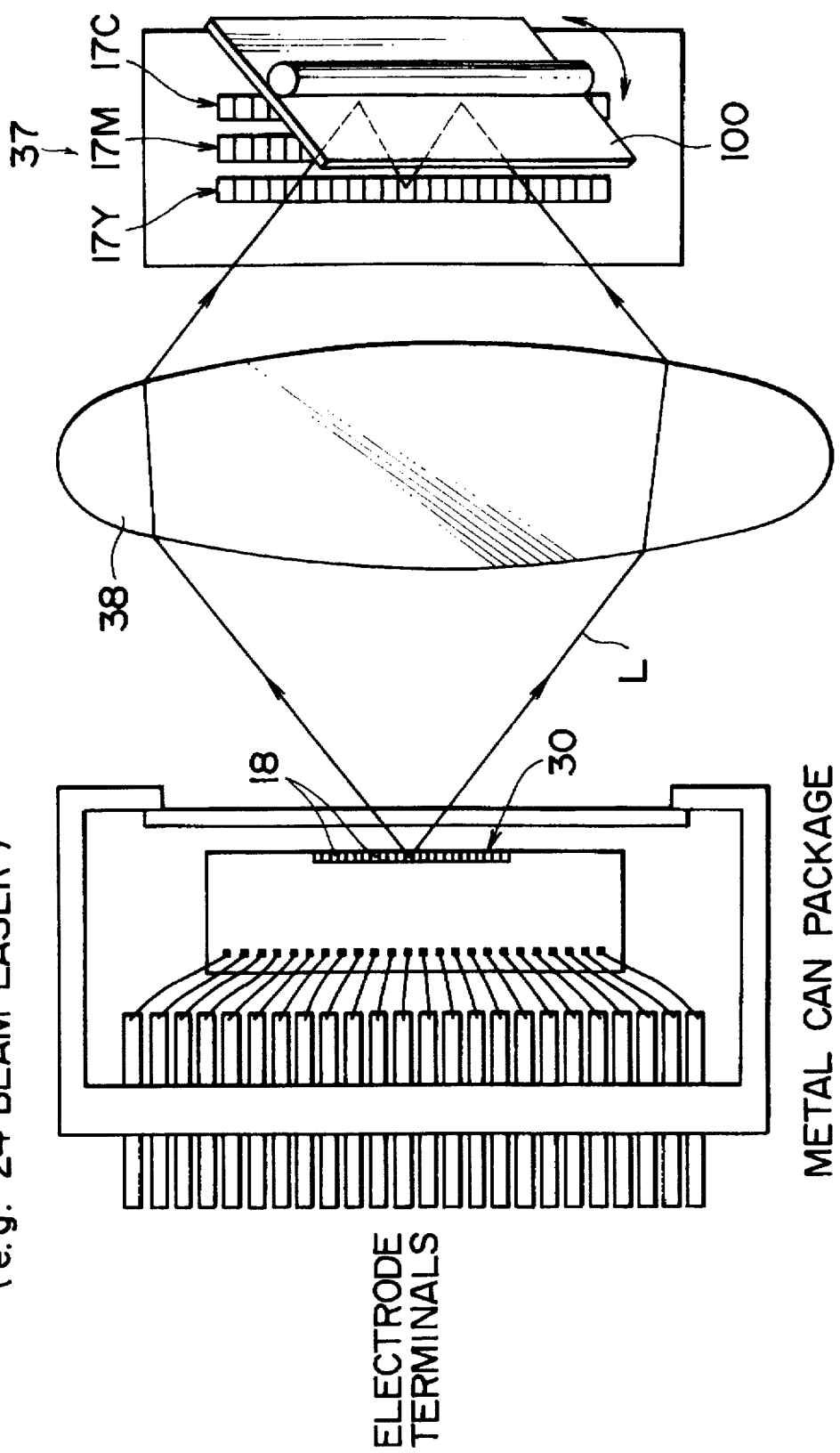
FIG. 6 is a schematic view of another example of the same printer head.

FIG. 6 is a schematic view showing the specific structure of the aforesaid printer head. According to this structure, this laser beam L from the common laser array 30 may be guided to predetermined dye dots not only by the aforesaid microlens array 31, but also by a single converging lens 38. This structure may also be applied in FIGS. 5A and 5B, as shown by a semi-broken line.

As described hereintofore, according to this example, the path of the laser beam L from the single laser array 30 is changed so that the beam is selectively guided to a dye, and the dye is thereby vaporized. This process is repeated for each color, and by superposing dots of for example three colors (yellow, magenta, cyan), full color printing may be performed.

When performing multi-color printing such as full color printing, for example, only one laser array 30 is required to print all colors. This makes positioning easier and more precise, and the structure of the package is simplified. There is no need to provide a plurality of laser arrays corresponding to each color as described hereinabove, hence no need to position each of these arrays individually. The device may be therefore be simply assembled without the need for any extraneous optical parts, which is highly advantageous from the viewpoints of packaging and cost. Further, the laser array 30 is easily manufactured, and the electrode wiring required may be accomplished without difficulty.

Moreover, scanning is performed by changing the path of the laser beam L using the simple, compact mirror 100, so the printer head may be easily constructed at low cost.

In a printer 81 according to this example, the printer head 40 is free to be moved back and forth in the head feed direction Y perpendicular to the feed direction of the imaging paper 50 by means of a head feed axis 42 consisting of a feed screw mechanism and a head support axis 43, as shown in FIGS. 4A and 4B. A head receiving roller 44 is provided free to rotate above the head 40 so as to grip the imaging paper 50. The imaging paper 50 moves in the feed direction X gripped between a paper feed drive roller 45 and a driven roller 46. The head 40, moreover, is respectively connected to head drive circuit boards, not shown, via a flexible harness 87.

For each vaporizer, corresponding laser beams emitted by a multi-laser array 30 comprising for example from 12 to 24 lasers (in particular, semiconductor laser chips) 18, are respectively focused by a micro-lens array 31 comprising a plurality of converging lenses 19. The multi-laser array 30 is driven by a control IC 34 provided in a base 33, generated heat being adequately dissipated by a heat sink 35.

The printer head 40 according to this example, the laser beam printer 81 using the printer head 40 and the recording method using these devices achieves the same effect as the non-contact dye vaporizing laser beam printer described hereintofore wherein the dye 22 is heated and vaporized by the laser beam L produced by the laser 18, and then carried onto and transferred to the imaging paper 50.

Figure 7:
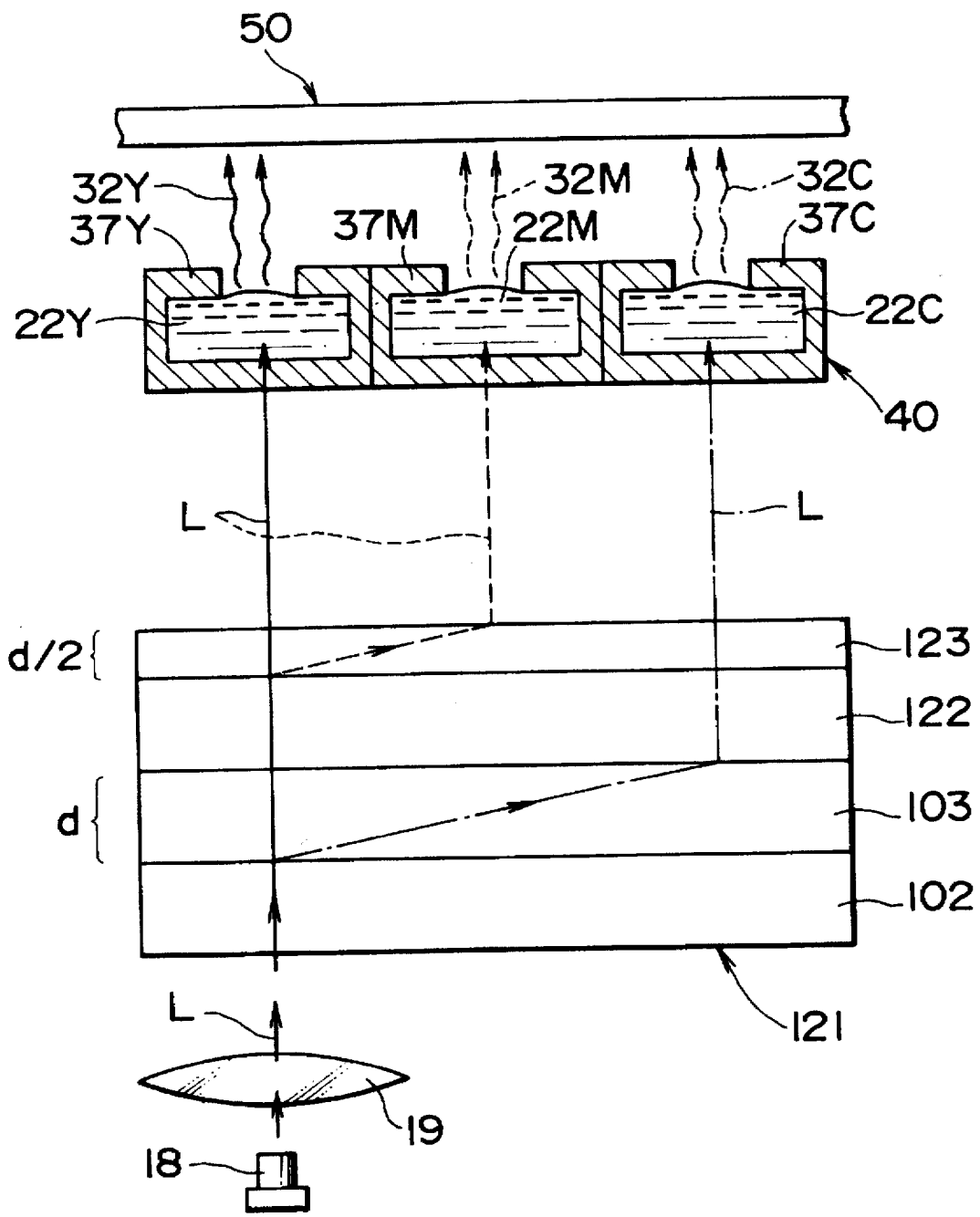
FIG. 7 is a schematic sectional view of a printer head according to a second embodiment of this invention.
Figure 8:
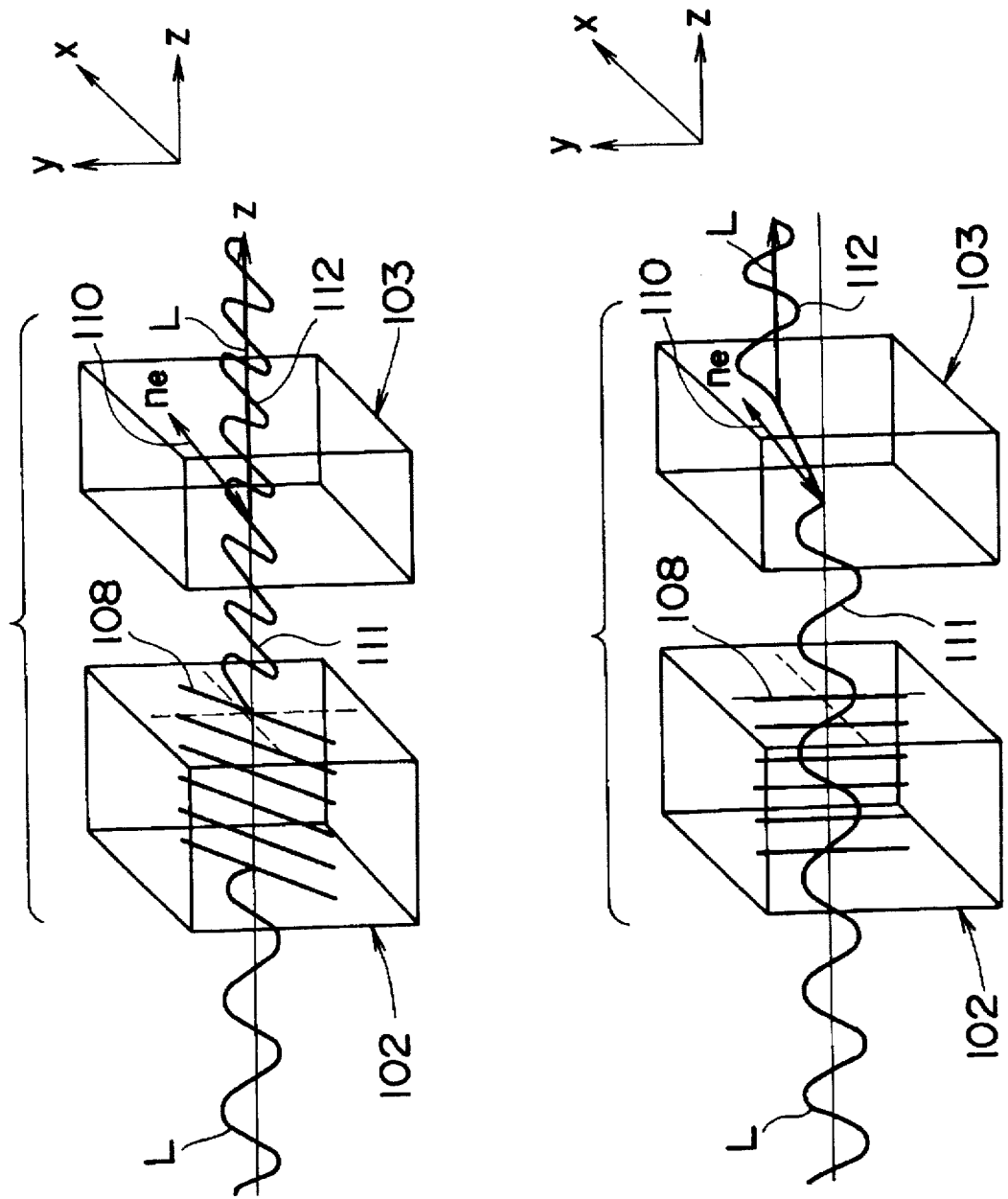
FIGS. 8A and 8B illustrate a schematic view showing different switching states of a wobbling element used in the same printer head.

FIGS. 7 and 8A and 8B show a second example wherein this invention is applied to a non-contact dye vaporizing laser beam printer.

According to this embodiment, instead of the galvanized mirror 100 shown in FIG. 2, a wobbling element 121 is used as a means of changing the path of the laser beam L. This wobbling element 121 is formed by alternately combining a plurality of (e.g. two) ferroelectric liquid crystals (FLC) 102, 122, and a plurality of (e.g. two) birefringence media 103, 123 consisting of transparent substrates such as quartz plates, as phase modulating optical devices which are successively inserted in the same optical path of the light beam.

In principle, these devices are superposed so as to shift the optic axis by $1, \frac{1}{2}, \frac{1}{4}, \ldots \frac{1}{2^n}$ (herein, n=2) when the shift of optic axis given by a birefringence medium of thickness d isl. More specifically, the thickness of the quartz plates 103, 123 in FIG. 7 is progressively reduced from d to d/2. Further, by providing abnormal orientations of the optic axis of the birefringence medium when superposing components, wobbling that exhibits a 4 point optical path shift (in practice, a 3 point optical path shift is sufficient) over a distance of $1(2-\frac{1}{4})$ when the liquid crystal devices 102, 122 are driven, can be performed. Each point of this 4 point optical path shift may be successively selected by switching in the liquid crystal devices, thereby selectively directing the laser beam L towards one of the dye receptacles 37Y, 37M, 37C.

The mechanism whereby the wobbling element 121 changes the path of the laser beam L between the solid line direction and the imaginary line direction is as follows. In the case where for example the ferroelectric liquid crystal 102 is in the switching state shown in FIG. 8A, the angle between the polarization plane of the laser beam L and an abnormal optic axis 108 is arranged to be approximately 45 degrees. A transmitted light beam 111 is thereby rotated in the direction of the abnormal optic axis, and the polarization state of the ferroelectric liquid crystal 102 is varied in the sense linear polarization (y axis direction)→elliptical polarization→circular polarization→elliptical polarization→linear polarization (x axis direction) so that the polarization plane is rotated from its initial state through 90 degrees. The beam then irradiates the quartz plate 103. As an abnormal optic axis 110 of the liquid crystal is not contained in the polarization plane of the incident light, the beam 111 is not refracted, so the same optic axis is maintained and the light again emerges as the beam L. This emergent beam L then traverses the ferroelectric liquid crystal 122 and quartz plate 123 to be used as the dye heating laser beam L shown in FIG. 7.

Next, when the switching state of the ferroelectric liquid crystal 102 is in the switching state shown in FIG. 8B, the polarization plane of the incident laser beam L and the abnormal axis of the ferroelectric liquid crystal 108 are parallel, so the transmitted beam 111 irradiates the quartz plate 103 which has birefringence, with the same plane of polarization. As the abnormal axis 110 of the liquid crystal is contained in the plane of polarization of the incident light, light that is polarized in the y axis direction is refracted in a direction toward the abnormal axis 110 of the quartz plate 103, and when it again emerges into an air layer as the emergent beam L, it is parallel to the optic axis but with a shift in the y direction with respect to the optic axis of the incident light. This emergent beam n then traverses the ferroelectric liquid crystal 122 and quartz plate 123 to be used as the dye heating laser beam L shown in FIG. 7.

The laser beam which traverses the ferroelectric liquid crystal 122 and quartz plate 123, as in the case when it traverses the aforesaid ferroelectric liquid crystal 102 and quartz plate 103, may be changed over between the broken line or semi-broken line in FIG. 7 depending on the switching state of the ferroelectric liquid crystal 122.

In this way, the laser beam L is selectively directed towards the dye receptacles during recording by superposing a plurality of devices, so that a good full color image may be obtained.

In practice, the ferroelectric liquid crystals 102, 122 may for example consist of chiral smectic liquid crystals sealed between orienting films and a pair of glass substrates with transparent electrodes, details being omitted in the drawings. In these liquid crystal devices 102, 122, the orientation of the abnormal axis 108 is changed and the switching state of the devices is altered by switching a voltage applied to the pair of transparent electrodes, on or off.

According to this example, a wobbling element is used to change the path of the laser beam L as in the preceding embodiment. Moreover, this path change-over is accomplished by a wobbling element using a liquid crystal panel with simple electrodes, and as a precision optical system or mechanical parts are not required, the method is exceedingly advantageous from the viewpoints of simplicity of construction, power consumption and cost.

Figure 9:
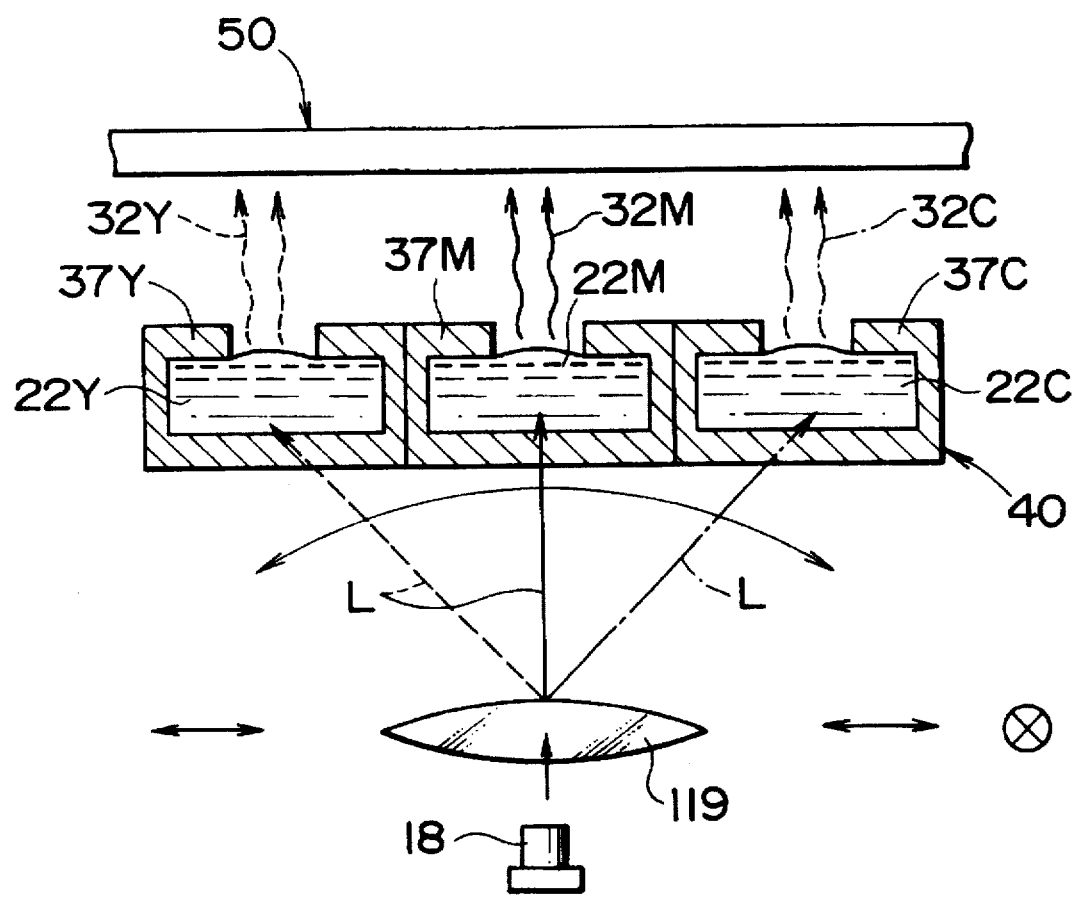
FIG. 9 is a schematic sectional view of a printer head according to a third embodiment of this invention.

FIG. 9 shows a third embodiment of this invention applied to a non-contact type dye vaporizing laser beam printer.

According to this embodiment, instead of the galvanized mirror shown in FIG. 2, a movable focusing lens 119 is provided as a means of changing the path of the laser beam L. This movable focusing lens 119 employs a conventional tracking servo mechanism (with a voice coil) of the type used in optical disks, this lens being driven forwards and backward by a drive signal.

Therefore, during output monitoring, the focusing lens 119 may be simply moved so as to direct the laser beam L towards the dye receptacles 22Y, 22M, 22C, hence recording may be performed with a very simple structure and at low cost.

Figure 10:
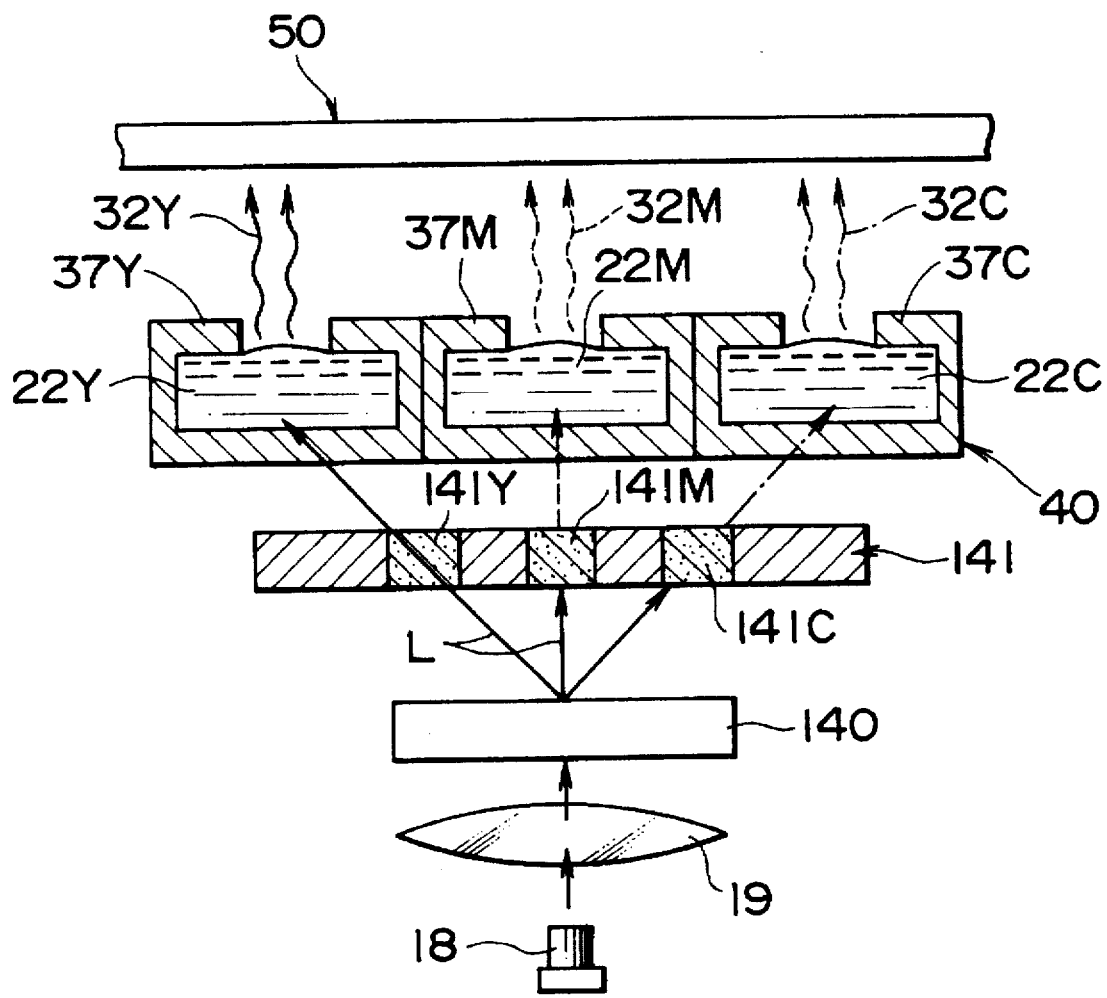
FIG. 10 is a schematic sectional view of a printer head according to a fourth embodiment of this invention.

FIG. 10 shows a fourth embodiment of this invention applied to a non-contact type dye vaporizing laser beam printer.

According to this embodiment, the laser beam path change-over means consists of a combination of a diffraction member 140 such as a grating (diffraction grating), and a shutter member 141 such as a liquid crystal shutter. The beam L is split into a plurality of beams by the grating 140, the shutter member 141 (e.g. liquid crystal shutter) being installed at a later stage. Liquid crystal devices 141Y, 141M, 141C are switched on or off in order to access the dyes 22Y, 22M, 22C.

This may easily be realized by means of an applied voltage fed to electrodes on the liquid crystal devices. By changing the polarization direction, the laser beam L may for example be made to pass only through the liquid crystal device 141Y as shown in FIG. 10 so that the beam impinges on the yellow dye, and by repeating the process successively for each color, full color printing may be performed.

According to this embodiment, on a relatively practical level, the head may be manufactured from an ordinary low-cost, optical device.

Figure 11:
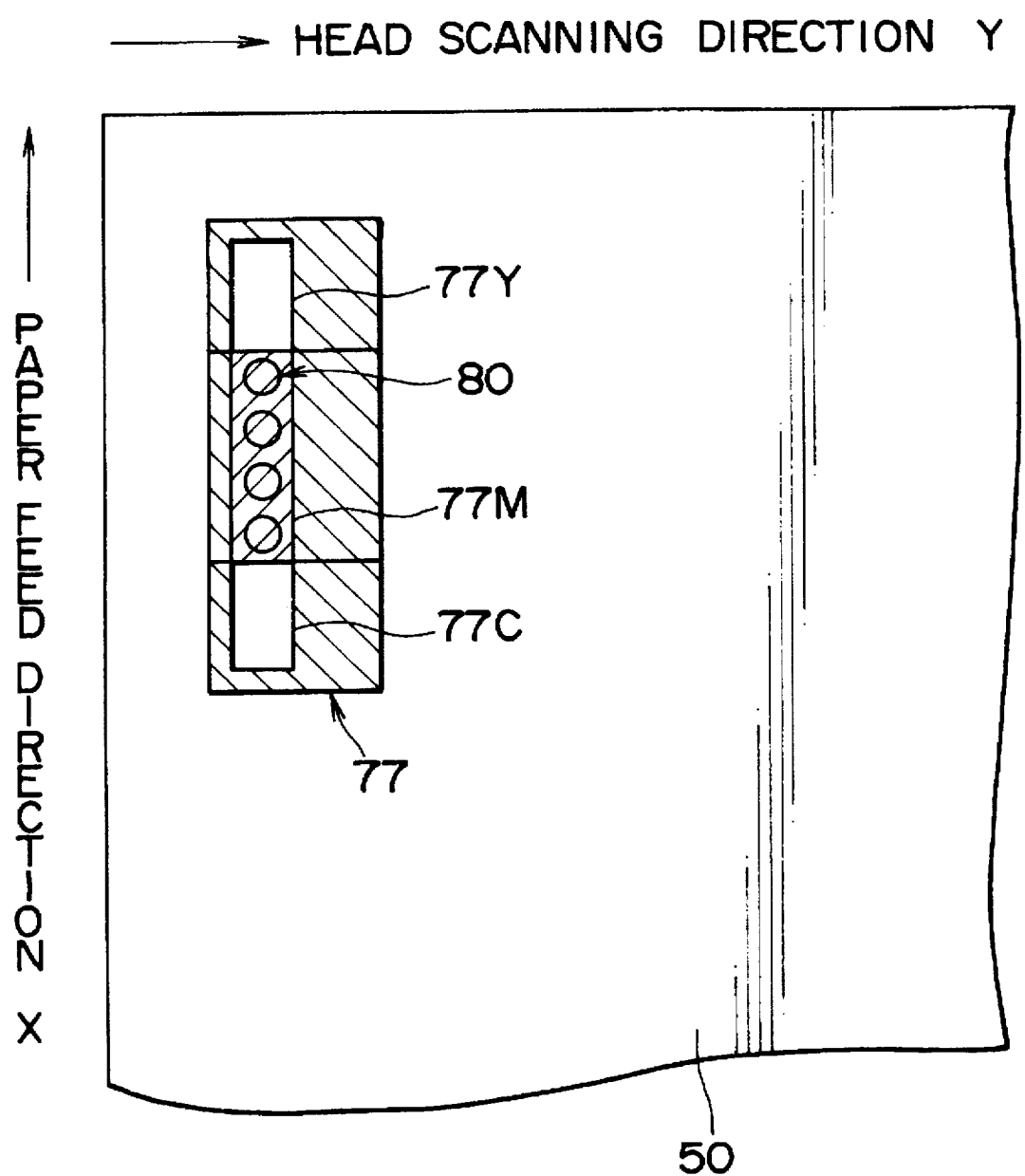
FIG. 11 is a schematic sectional view of a printer head according to a fifth embodiment of this invention.

FIGS. 11–13 show a fifth embodiment of this invention applied to a non-contact type dye vaporizing laser beam printer.

According to this embodiment, only one laser array 80 is used as in the case of the aforesaid embodiments, but its length is effectively ⅓ of the overall length of the head. Further, unlike the case of the aforesaid embodiments, one head 77 is partitioned into dye receptacles 77C, 77M, 77Y for each color, and the laser array 80 is positioned under only one of these, e.g. the magenta dye receptacle 77M.

In other words, the path of the emergent beam L from the laser array 80, which is approximately ⅓ the length of the head 77, is directed toward each dye as shown in FIG. 12. For this purpose, the path of the beam L is changed between the solid line, broken line, and semi-broken line by a path change-over means such as the galvanized mirror or wobbling element described hereintofore.

The head 77 is successively scanned in the Y direction for each color, and by moving the imaging paper 50 in the X direction by ⅓ of the length of the head (⅓ pitch) at a time during scanning, different colors are superposed (superposition scanning) so as to obtain a printed image.

Figure 13A:
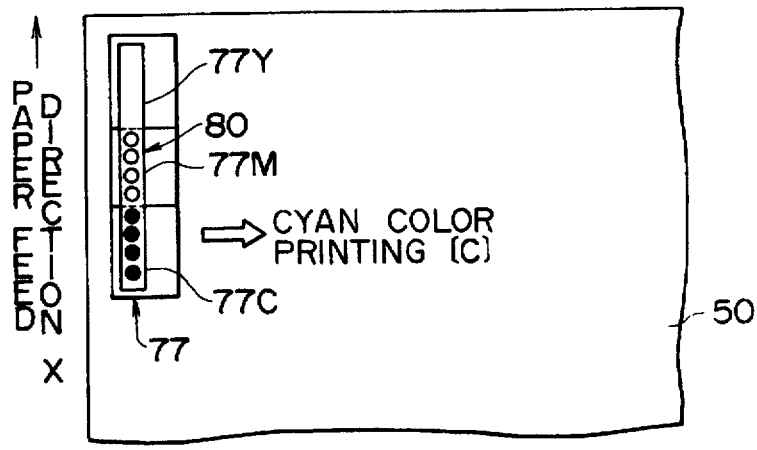
FIGS. 13A, 13B and 13C are schematic rear views of the scan performed by the same head for each color in succession.

More specifically, as shown for example in FIG. 13A, the part of the laser beam L corresponding to the cyan dye receptacle 77C irradiates the receptacle, and while the head 77 is scanning in the Y direction, dot printing with cyan dye is performed over ⅓ the length of the head. The printed area is shown by the round black dots in the drawing (the same hereinafter).

Figure 13B:
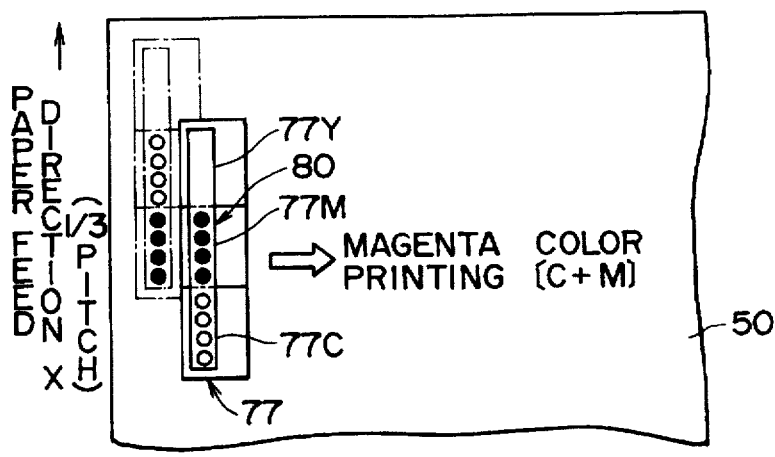
Figure 13C:
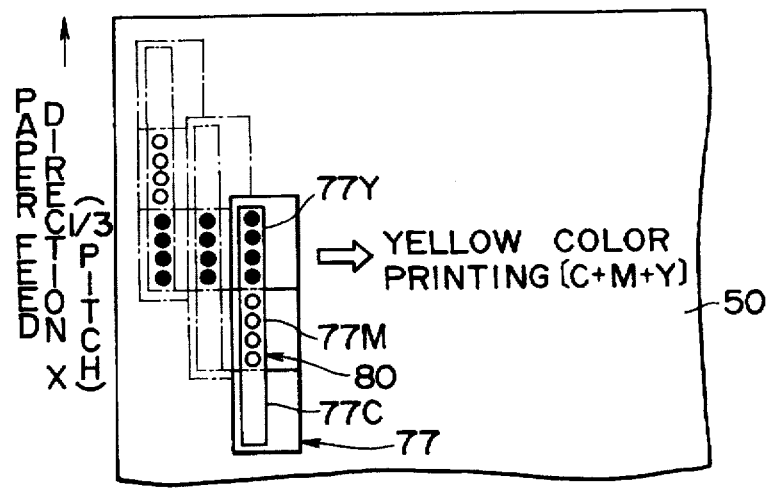

Next, as shown in FIG. 13B, the head 77 is returned to the original position (left-hand side of the imaging paper 50 in the drawing), and the imaging paper 50 is advanced in the X direction by ⅓ (⅓ pitch) as described hereintofore. In the drawing, the position of the head 77 is shifted for the sake of understanding, although it has actually returned to its original position.

In this state, as the head again scans in the Y direction, the part of the laser beam corresponding to the magenta dye receptacle 77M irradiates the receptacle, and dot printing with magenta dye is performed over a ⅓ length (⅓ pitch) so as to be superposed on the cyan color dots that were previously printed.

Next, as shown in FIG. 13C, the head 77 is again returned to the original position (left-hand side of the imaging paper 50 in the drawing), and the imaging paper 50 is advanced in the X direction by ⅓ (⅓ pitch) as described hereintofore. In the drawing, the position of the head 77 is shifted for the sake of understanding, although it has actually returned to its original position.

In this state, as the head again scans in the Y direction, the part of the laser beam corresponding to the yellow dye receptacle 77Y irradiates the receptacle, and dot printing with yellow dye is performed over a ⅓ length (⅓ pitch) so as to be superposed on the cyan color dots and magenta color dots that were previously printed.

Hence, by moving the paper by ⅓ the head length each time the head 77 scans in the Y direction, dyes of three colors are vaporized and transferred to the imaging paper 50 to be superposed on one another so as to print a full color image consisting of C (first pass), M (second pass) and Y (third pass).

Therefore, in order to perform multi-color printing such as full color printing, a single laser array 80 is sufficient for all colors. As the array can be short in length, its positioning is easier and more precise, and its incorporation in a package is simplified. As in the case of the aforesaid examples no extraneous optical parts are used, hence it can be easily assembled, which is extremely advantageous from the viewpoints of packaging and cost. Moreover, the laser array 80 is easy to manufacture, and the electrode wiring involved is not difficult.

Compared to the case of the laser array 30 shown in FIG. 3, the amount of paper feed decreases when the number of dyes increases so that the printing speed is slightly less. However, there is still a great advantage in that the laser array itself, which is the key device, is easily manufactured.

Printing speed can easily be improved by making the head even longer (i.e., increasing the number of dye dots or increasing the number of laser beams). Even if the number of beams is increased, the array is still one-dimensional, hence present-day laser technology is sufficient without having recourse to a planar light-emitting laser such as a two-dimensional array which is difficult to manufacture, and there are no wiring problems as there would be with a two-dimensional array. Therefore, considering only laser characteristics, it is expedient to make the array as long as possible which will permit a corresponding increase of printing speed.

Figure 14:
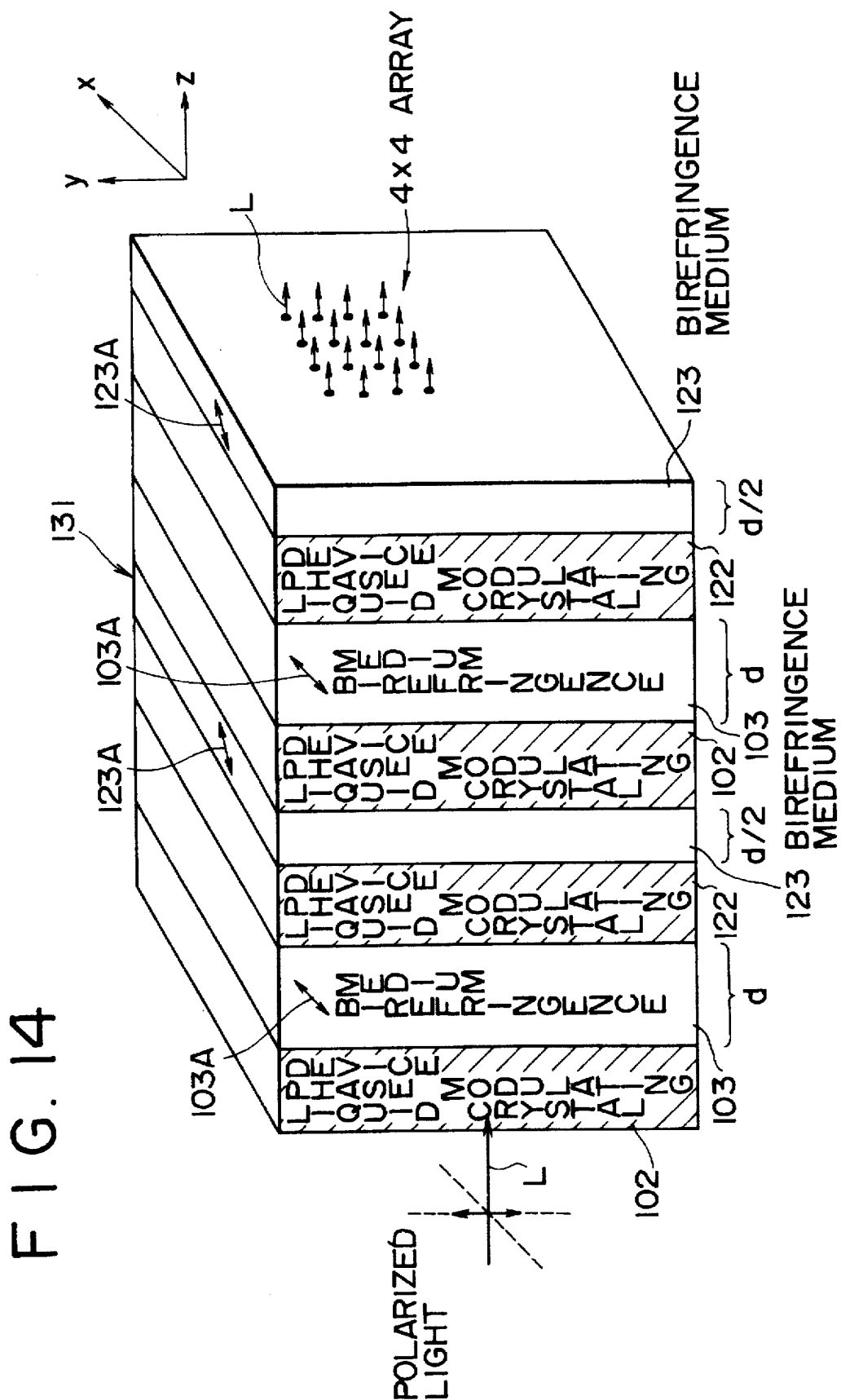
FIG. 14 is a schematic view of a wobbling element used by the printer head according to a sixth embodiment of this invention.
Figure 15:
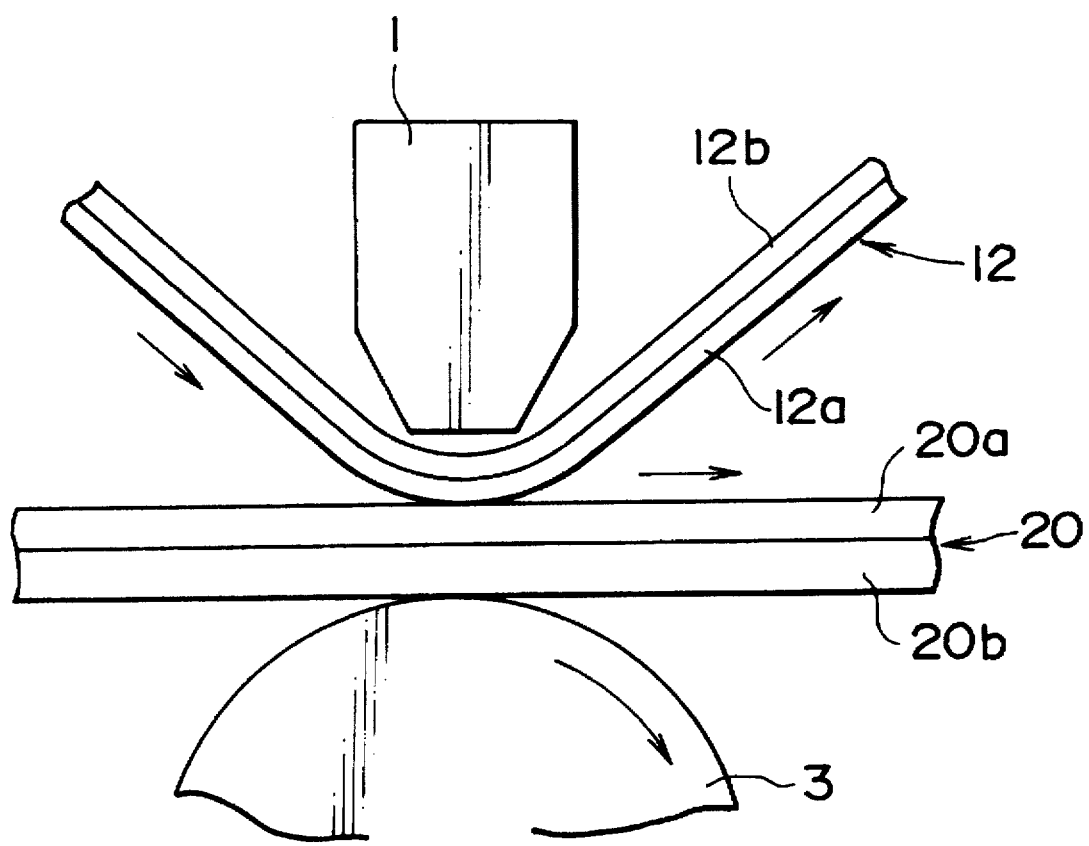
FIG. 15 is a front view of the essential parts of a printer using a conventional thermosensitive recording head.
Figure 16:
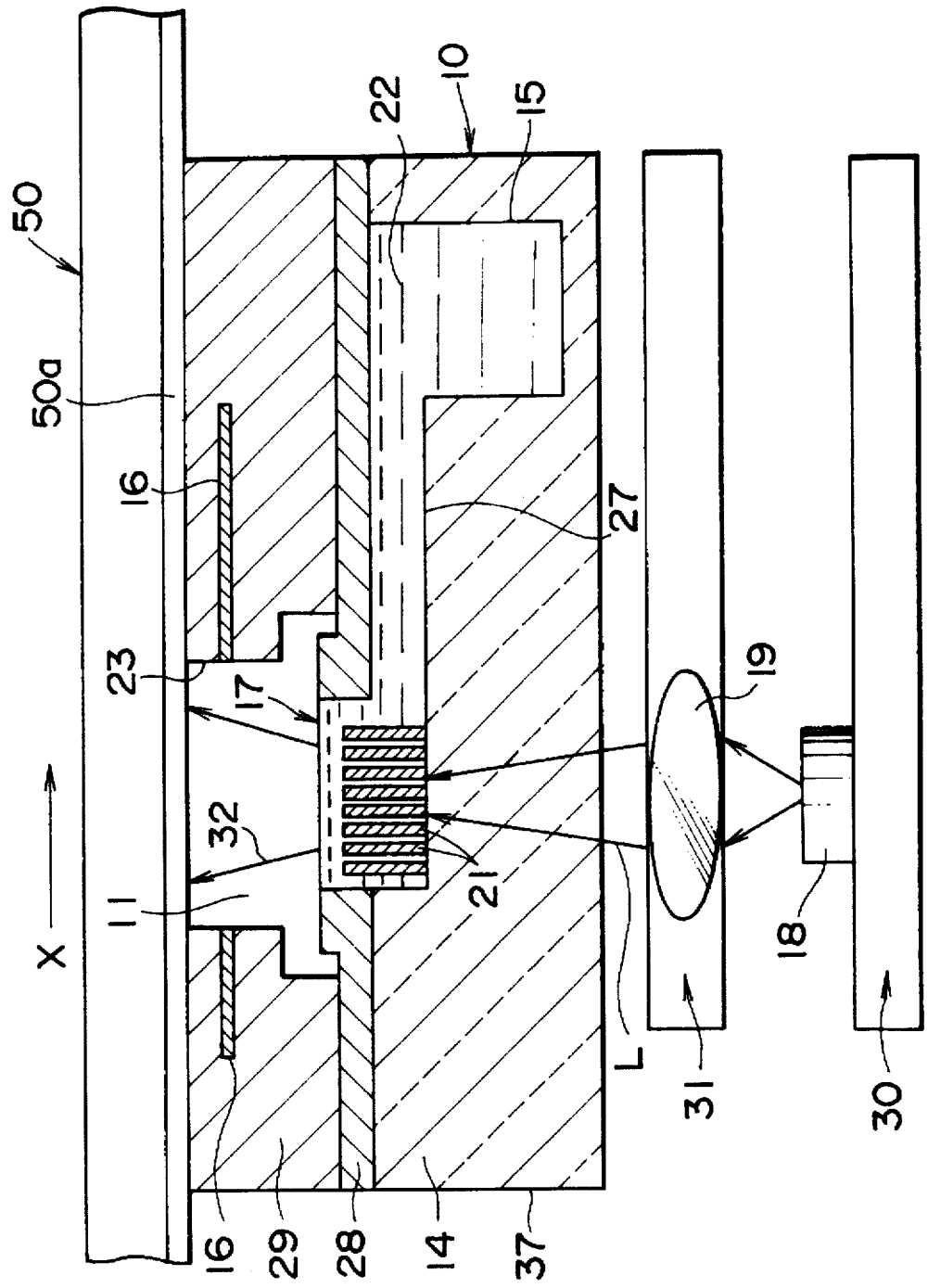
FIG. 16 is a schematic sectional view of a printer head that was proposed before this invention was completed.
Figure 17:
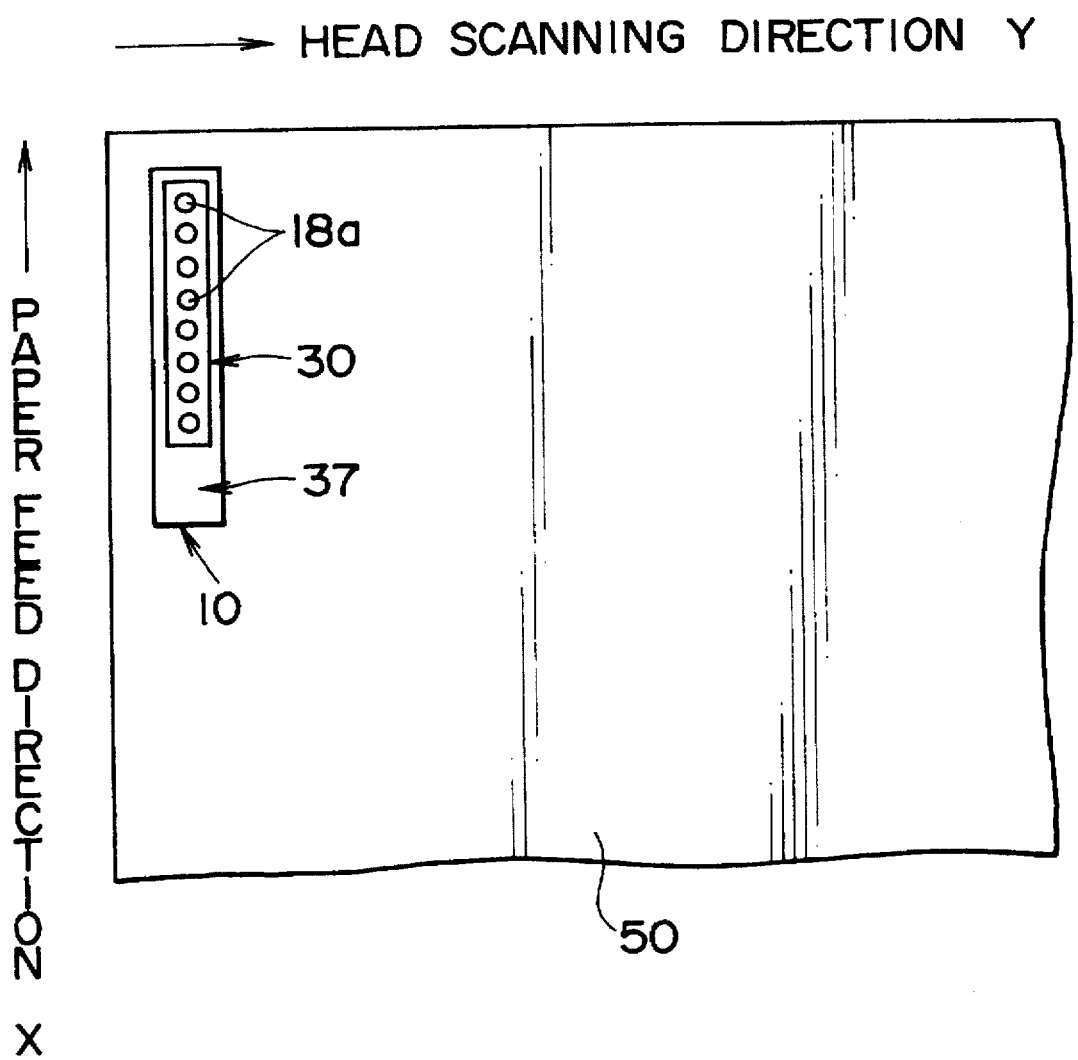
FIG. 17 is a schematic rear view of the same printer head.
Figure 18:
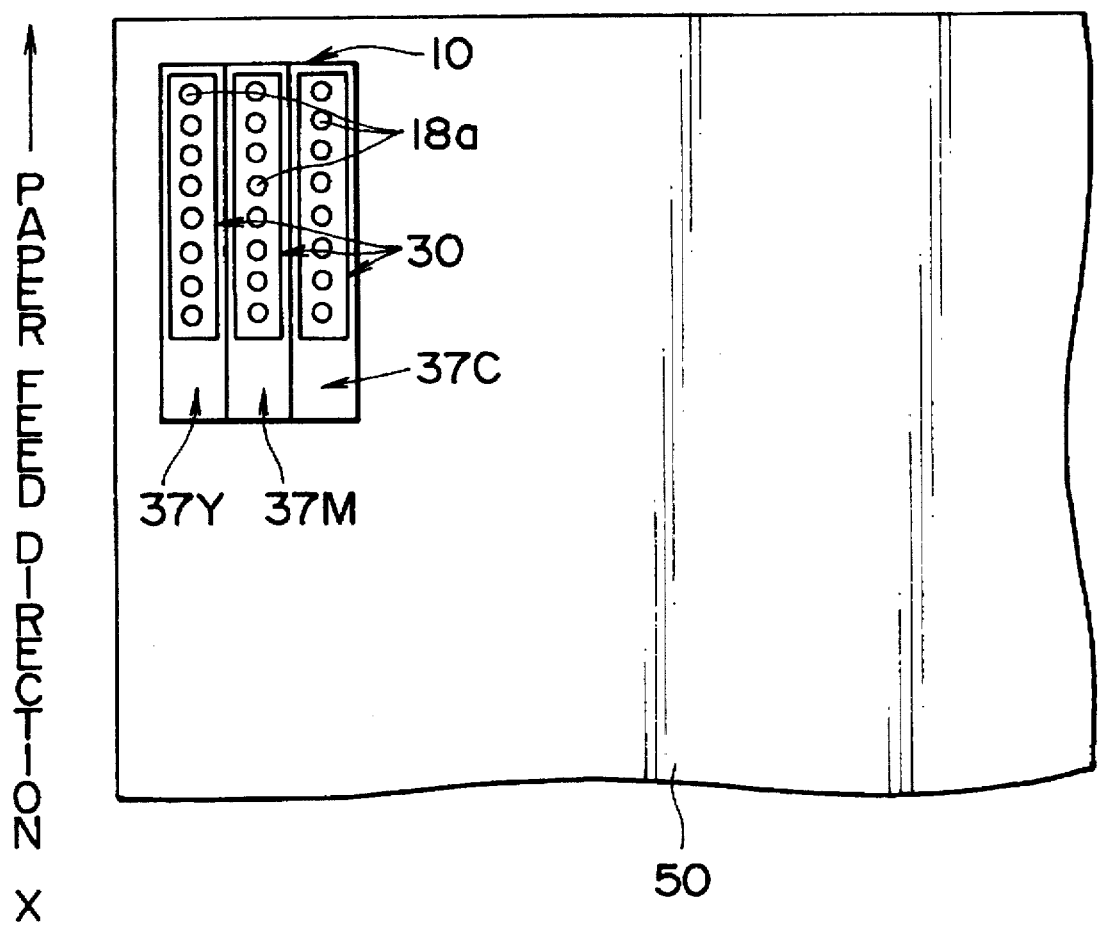
FIG. 18 is a schematic rear view of another printer head.
Figure 19:
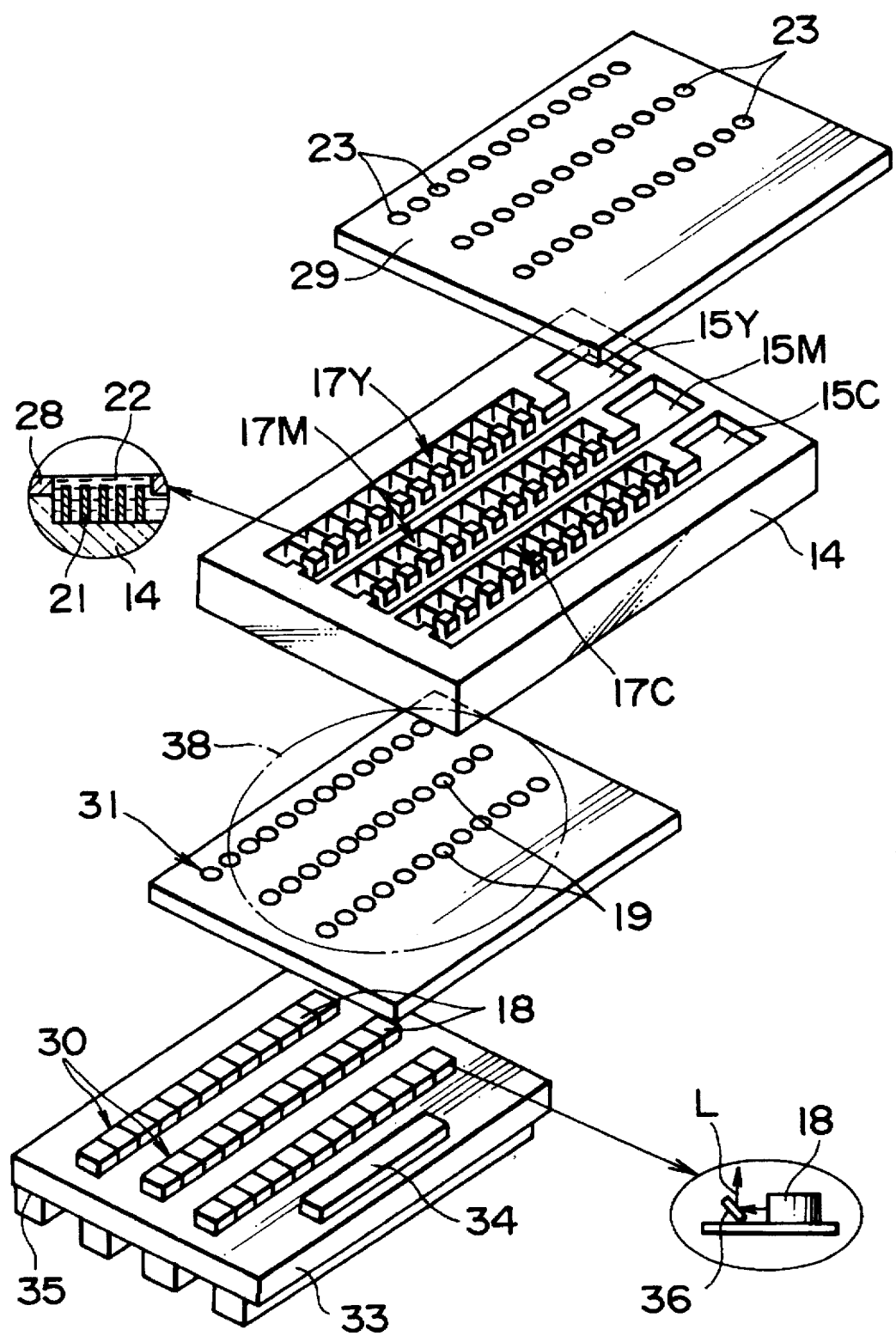
FIGS. 19A, 19B and 19C illustrate a cutaway perspective view of the same printer head.
Figure 20:
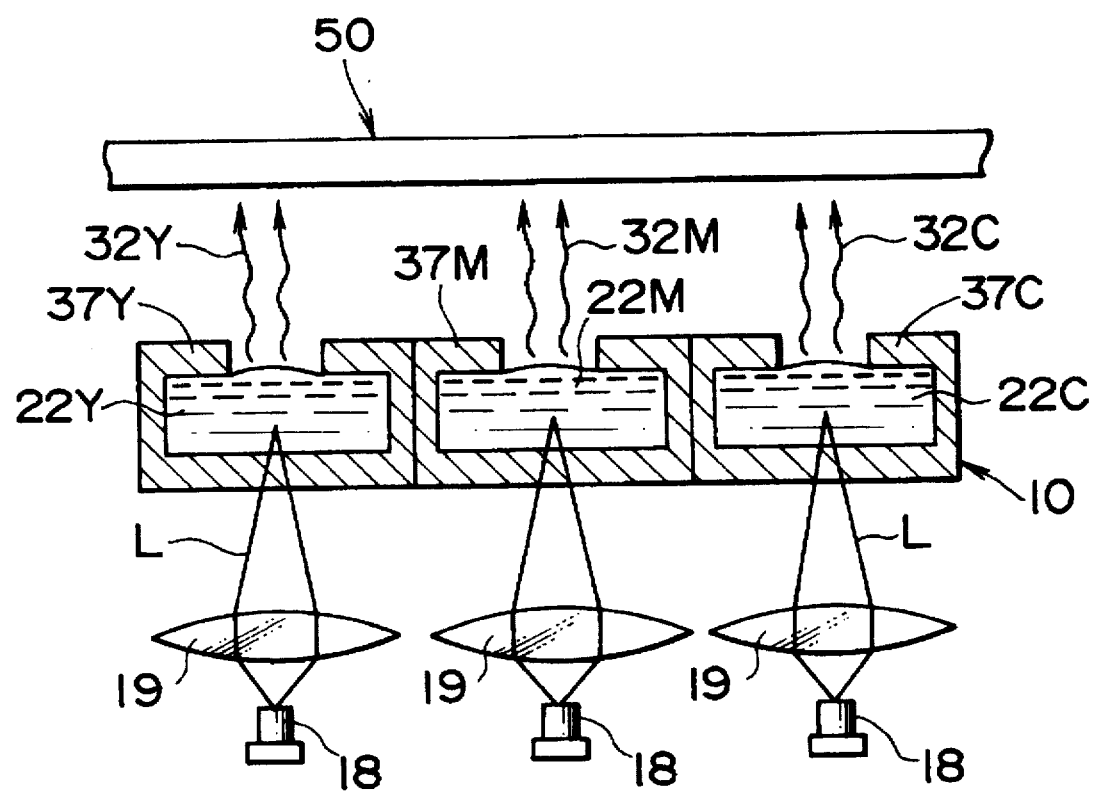
FIG. 20 is a schematic sectional view of the same printer head.
Figure 21:
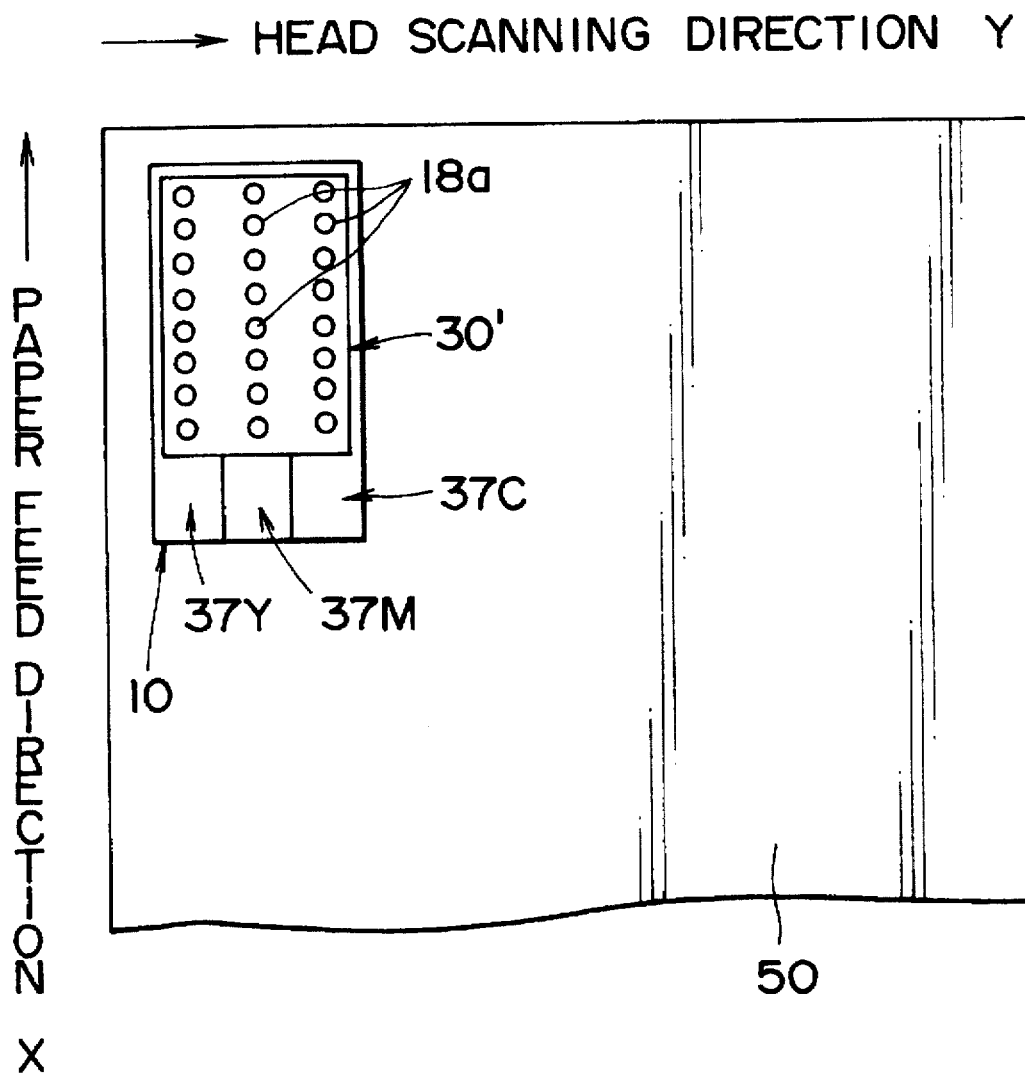
FIG. 21 is a schematic rear view of yet another printer.

FIG. 14 shows a sixth embodiment of this invention applied to a non-contact type dye vaporizing laser beam printer.

According to this embodiment, two sets 102–103, 122–123 are added to the ferroelectric liquid crystal and quartz plate comprising the wobbling element in FIG. 7 so as to form a laminated wobbling element 131.

For example, by superposing 4 sets of wobbling elements (n=4) using quartz plates of different thickness as shown in FIG. 14 (where an abnormal optic axis 103A of the quartz plate 103 is the y direction, and an abnormal optic axis 123A of the quartz plate 123 is the x–z direction), a 4×4 point optic axis shift (change of laser beam path) in the (x–y) plane can be performed.

By increasing the number (n) of wobbling elements superposed, the element shown in FIG. 14 can be switched through various combinations of switching states, for example the laser beam can be made to impinge on dots of a specific color in the y direction (e.g. yellow), or on dots of another color in the x direction (e.g. magenta), so as to selectively direct the laser beam to different color dyes and perform full color printing.

In the case of this example, therefore, the optic axis can be shifted by wobbling also in the plane of the head, hence the number of beams (light-emitting points) of the laser array may be reduced or it may be unnecessary to use a multi-beam laser so that manufacture of the laser array is further simplified.

Several examples of this invention have been described, however various modifications of these are possible within the spirit and scope of the invention.

For example, the beam path change-over means may be another movable compact reflecting mirror such as a DMD (deformable mirror device), or other types of device such as gratings or shutters may be used. The heating beam may also be an emergent beam generated by any type of laser including a semiconductor laser.

The position of the beam path change-over means may also be varied, and it may be placed in any desired position provided that it is underneath the dye receptacles or in their vicinity. Moreover, in the case of FIG. 14, the path in one plane was changed in the x–y directions, however in the case of FIG. 9 for example, the focusing lens may also be moved (or turned) in a direction perpendicular to the plane of the paper.

The head or printer may have any suitable structure or shape in addition to those described hereinabove, and other suitable materials may be used for the component parts of the head. Further, in addition to performing full color printing with magenta, yellow and cyan (together with black), two-color printing, monochrome printing or black and white recording is possible. Further, other heating beams apart from a laser beam may be used as energy source to vaporize or sublime the dyes or recording materials.

Multi-color or full color printing may be performed by means of the aforesaid example, however monochrome or black and white printing may be performed by directing the beam to a plurality of dye dots of the same color using the aforesaid beam path change-over means (this can be achieved for example by modifying the cases of FIGS. 11–13).

The head may be a scanning type that scans one line at a time (serial type), or a fixed type (line type), provided that it employs a heating beam (in this sense, it may also be a contact type). In the case of a serial type, it is not necessarily limited to the aforesaid drive mechanism (e.g. the type shown in FIGS. 4A and 4B).

Further, in addition to the aforesaid types, wherein a solid dye is first liquefied and then vaporized, recording may also be performed by heating a solid dye with a laser beam so as to vaporize it directly (i.e. sublime it), alternatively a liquid dye (liquid at room temperature) may be contained in the dye receptacles. Moreover, the recording material may be transferred to the imaging paper by a phenomenon other than the aforesaid transport mechanism (for example, by evaporation). In this sense again, the head is not necessarily a non-contact type.

As described hereintofore, a recording material such as a dye is vaporized by irradiating it with a heating beam such as a laser beam, and transferred by transporting it to a recording medium such as an imaging paper. By changing the path of the heating beam from the heating beam emitting means, the beam is made to selectively impinge on a plurality of recording materials. The same heating beam emitting means may therefore be used for the plurality of recording materials, hence the structure of the head including the heating beam emitting means is simplified, and its assembly is simplified.

If the same (in particular, one) heating beam emitting means is used, its manufacture is simplified, and the electrode wiring in the heating beam emitting means may be easily implemented.

What is claimed is:

1. A recording head, comprising:
    a plurality of segregated recording materials having different colors and being disposed in adjacent receptacles, which segregated recording materials are vaporized by irradiation with a heating beam and then transferred to a recording medium;
    a heating beam emitting means for producing said heating beam; and
    a beam path change-over means that changes the path of said heating beam from said heating beam emitting means so that said heating beam selectively impinges on one of said plurality of recording materials having different colors.

2. A recording head as defined in claim 1 wherein said beam path change-over means is a mirror.

3. A recording head as defined in claim 2 wherein said mirror is a galvanized mirror.

4. A recording head as defined in claim 1 wherein said beam path change-over means is a wobbling element.

5. A recording head as defined in claim 1 wherein a focusing lens for the emergent beam from said heating beam emitting means is provided such that it is free to move, and said focusing lens is used as said beam path change-over means.

6. A recording head as defined in claim 1 wherein said beam path change-over means is a combination of a diffraction member and a shutter member.

7. A recording head as defined in claim 1 wherein said heating beam emitting means is common to each of said plurality of recording materials.

8. A recording head as defined in claim 7 wherein said heating beam emitting means is a multi-laser array.

9. A recording head as defined in claim 1 wherein recording material layers are separated from said recording medium by a gap, and vaporized recording materials are transferred to said recording medium across said gap.

10. A recording device comprising a recording head as defined in claim 1.

11. A recording method providing the steps of:
    providing a plurality of segregated recording materials having different colors, said plurality of segregated recording materials being disposed in adjacent receptacles;

providing a recording medium adjacent said recording materials;

providing a heating beam emitting device for producing a heating beam;

selectively impinging said heating beam on one of said plurality of recording materials, thereby vaporizing an amount of said recording material and thence transferring said vaporized amount of said recording material to said recording medium; and changing a path of said heating beam from said heating beam emitting device to a next one of said plurality of segregated recording materials having different colors.

12. The method according to claim 11, wherein said step of providing a plurality of different, segregated recording materials is further characterized in that said plurality of different segregated recording materials comprise at least three dyes having differing colors.

13. The method according to claim 12, comprising the further steps of:

providing said plurality of different segregated recording materials arranged in a recording head;

translating said recording head across said recording medium in a first direction; and translating said recording medium in a second direction with respect to said head, said second direction perpendicular to said first direction.

14. A recording head for color printing onto a recording medium, comprising:

a plurality of recording materials having different colors and segregated into receptacles;

a heating beam producing device mounted adjacent said receptacles to produce and direct a heating beam onto a selected one of said receptacles to vaporize a portion of the recording material therein, said receptacles arranged to allow said vaporized portion to impinge upon said recording medium; and a controlled change-over means for redirecting said heating beam to a select one of said receptacles.

15. A recording head as defined in claim 14, wherein said change-over means is a mirror.

16. A recording head as defined in claim 14, wherein said change-over means is a wobbling element.

17. A recording head as defined in claim 14, wherein said heating beam producing device comprises a focusing lens for the heating beam and said focusing lens free to be moved, said change-over means moves said lens to redirect said heating beam.

18. A recording head as defined in claim 14, wherein said change-over means is a combination of a diffraction member and a shutter member.

19. A recording head as defined in claim 14, wherein said heating beam producing device is common to each of said plurality of recording materials.

20. A recording head as defined in claim 19, wherein said heating beam producing device is a multi-laser array.

21. A recording head as defined in claim 14, wherein recording materials are separated from said recording medium by a gap, and said vaporized portion is transferred to said recording medium across said gap.

22. The recording head according to claim 14, wherein said plurality of recording materials include the colors yellow, magenta, and cyan respectively.

* * * * *